United States Patent
Watanabe et al.

(10) Patent No.: US 10,340,164 B2
(45) Date of Patent: Jul. 2, 2019

(54) SUBSTRATE PROCESSING APPARATUS, METHOD OF MEASURING TEMPERATURE OF SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Akihito Watanabe, Toyama (JP); Naoya Miyashita, Toyama (JP); Katsumi Takashima, Toyama (JP); Shigeru Honda, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 1171 days.

(21) Appl. No.: 14/549,738

(22) Filed: Nov. 21, 2014

(65) Prior Publication Data

US 2015/0099235 A1 Apr. 9, 2015

Related U.S. Application Data

(63) Continuation of application No. PCT/JP2013/064380, filed on May 23, 2013.

(30) Foreign Application Priority Data

May 28, 2012 (JP) .................... 2012-121203

(51) Int. Cl.
| | | |
|---|---|---|
| H01L 21/67 | (2006.01) | |
| H01L 21/677 | (2006.01) | |
| G01K 1/14 | (2006.01) | |

(52) U.S. Cl.
CPC ........ H01L 21/67248 (2013.01); G01K 1/146 (2013.01); H01L 21/67098 (2013.01);
(Continued)

(58) Field of Classification Search
None
See application file for complete search history.

(56) References Cited

U.S. PATENT DOCUMENTS 5,820,366 A * 10/1998 Lee .................. C23C 16/46
                                                           432/11
6,193,506 B1 * 2/2001 Muka .................. C23C 16/0209
                                                      432/239
(Continued)

FOREIGN PATENT DOCUMENTS

| JP | 07283163 A | 10/1995 |
|---|---|---|
| JP | H07-283163 A | 10/1995 |

(Continued)

OTHER PUBLICATIONS

Office Action in corresponding Korean Patent Application No. 10-2014-7032242, dated Feb. 28, 2017, with English translation.
(Continued)

*Primary Examiner* — Avinash A Savani
*Assistant Examiner* — Rabeeul I Zuberi
(74) *Attorney, Agent, or Firm* — Edell, Shapiro & Finnan, LLC

(57) ABSTRACT

Provided is a substrate processing apparatus capable of improving the workability of measuring a temperature-flat zone in a process furnace and the reliability of a temperature-flat length of a heater. The substrate processing apparatus includes a process chamber configured to process a substrate retained in a retainer loaded therein; a temperature measuring device configured to measure an inside temperature of the process chamber; a transfer device configured to transfer the substrate at least to the retainer; and a controller configured to control the transfer device and the temperature measuring device to move the transfer device to a predetermined position before the inside temperature of the process chamber is measured and to obtain the inside temperature by (Continued)

the temperature measuring device while vertically moving the transfer device with the temperature measuring device attached to the transfer device when the inside temperature of the process chamber is measured.

8 Claims, 18 Drawing Sheets

(52) U.S. Cl.
CPC .. *H01L 21/67109* (2013.01); *H01L 21/67739* (2013.01); *H01L 21/67757* (2013.01); *H01L 21/67763* (2013.01); *H01L 21/67781* (2013.01)

(56) References Cited

U.S. PATENT DOCUMENTS 6,329,643 B1 * 12/2001 Suzuki .................. C30B 25/10
                                                        219/497
2005/0067757 A1 * 3/2005 Suga ........................ B65H 3/48
                                                        271/98

FOREIGN PATENT DOCUMENTS

| | | |
|---|---|---|
| JP | 09005172 A | 1/1997 |
| JP | 2004022943 | 1/2004 |
| JP | 2008-117810 A | 5/2008 |
| JP | 2011090610 A | 5/2011 |
| JP | 2011-109040 A | 6/2011 |
| KR | 1997-0017970 A | 4/1997 |
| KR | 10-1999-0028033 A | 4/1999 |

OTHER PUBLICATIONS

International Search Report in counterpart International Application No. PCT/JP2013/064380, dated Aug. 20, 2013.

Office Action in corresponding Korean Patent Application No. 10-2014-7032242, dated Feb. 4, 2016, along with English Translation.

Office Action in corresponding Chinese Patent Application No. 201380027921.0, dated Mar. 29, 2016, along with English translation.

* cited by examiner

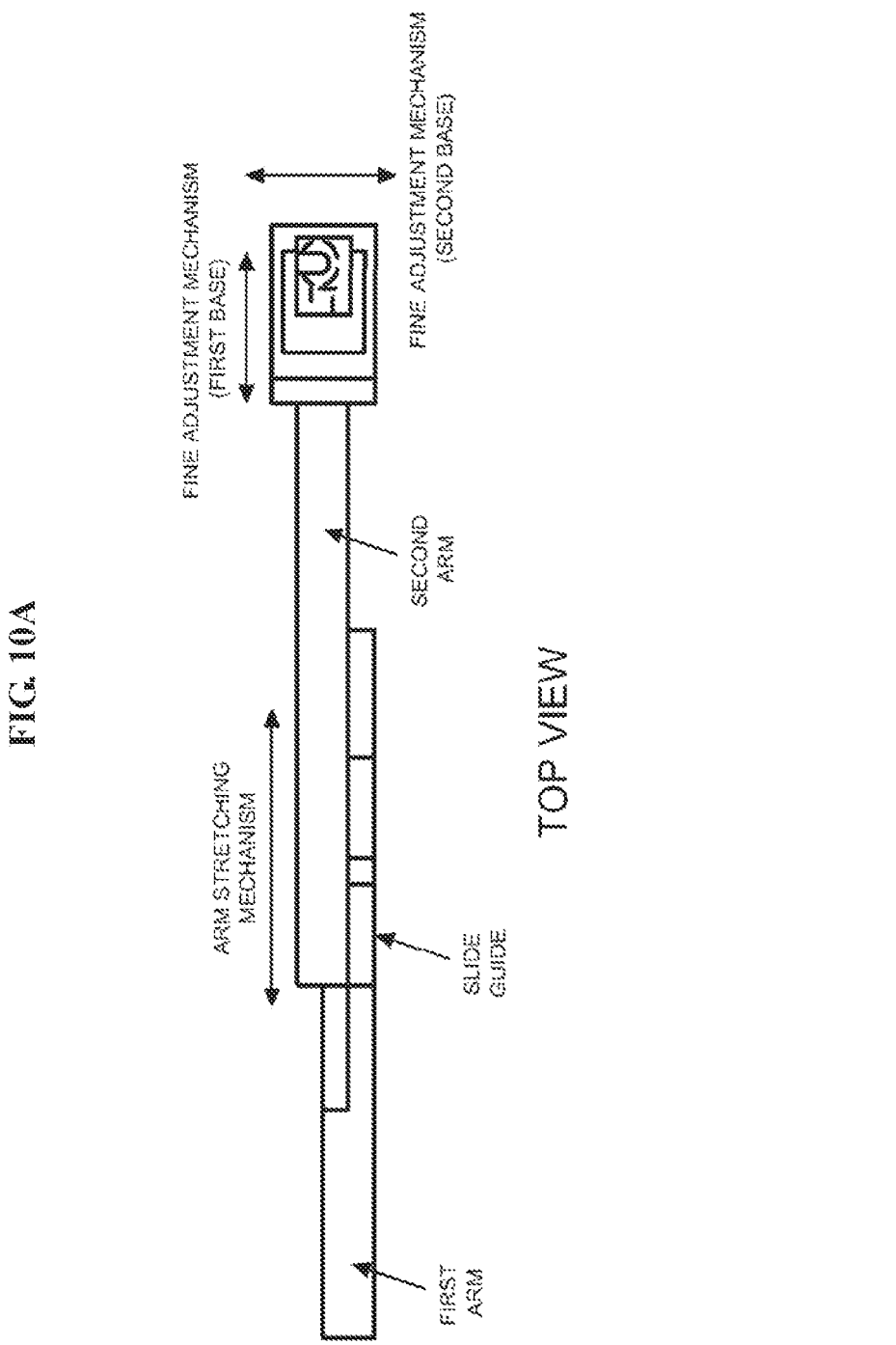

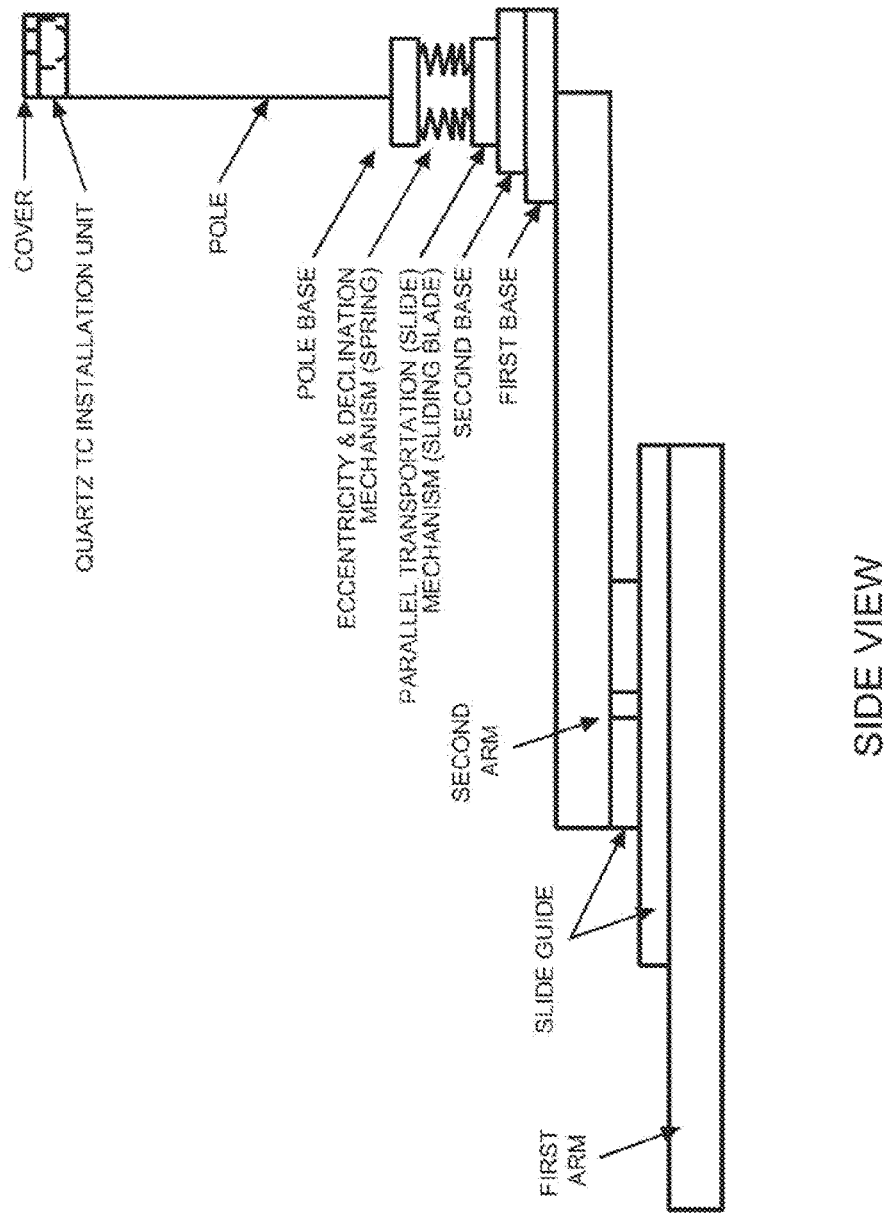

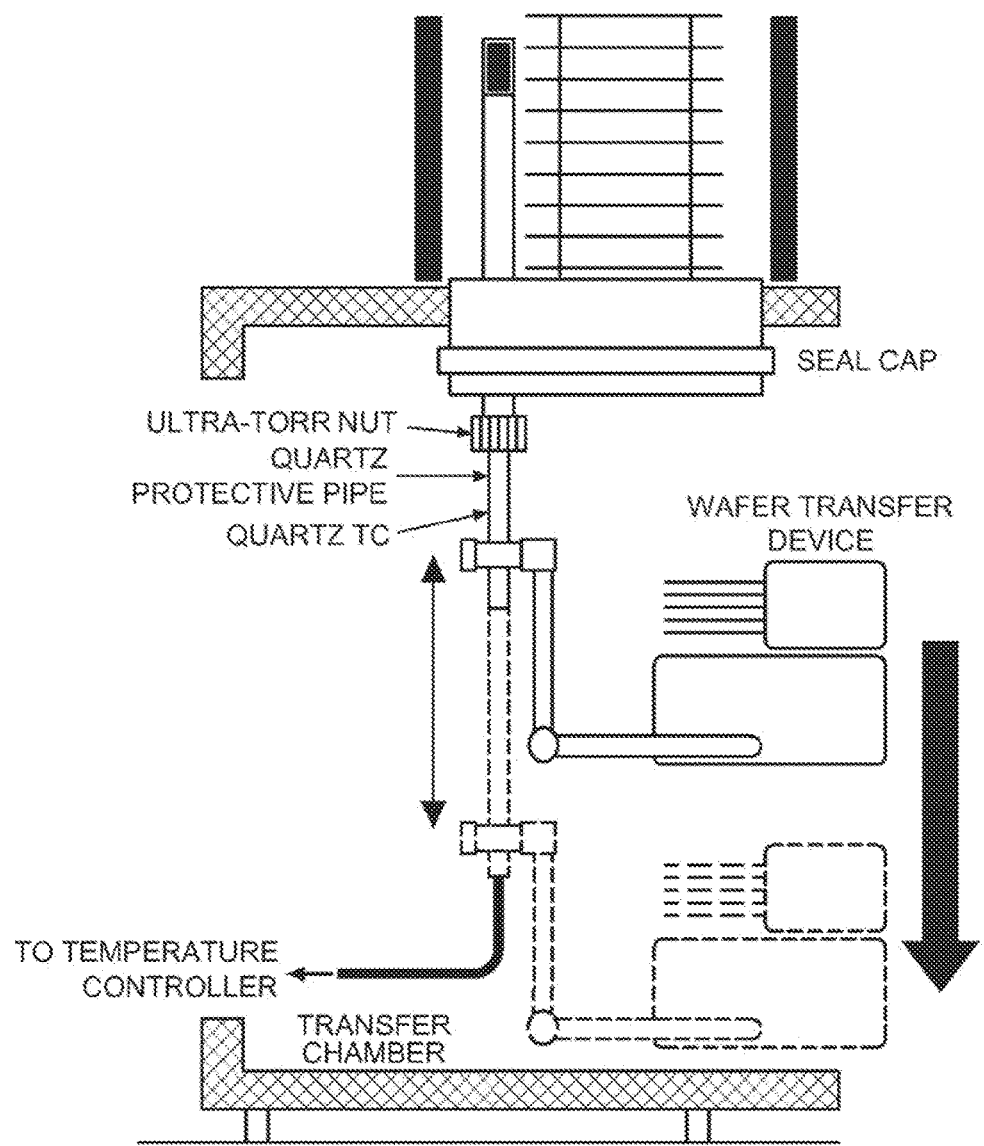

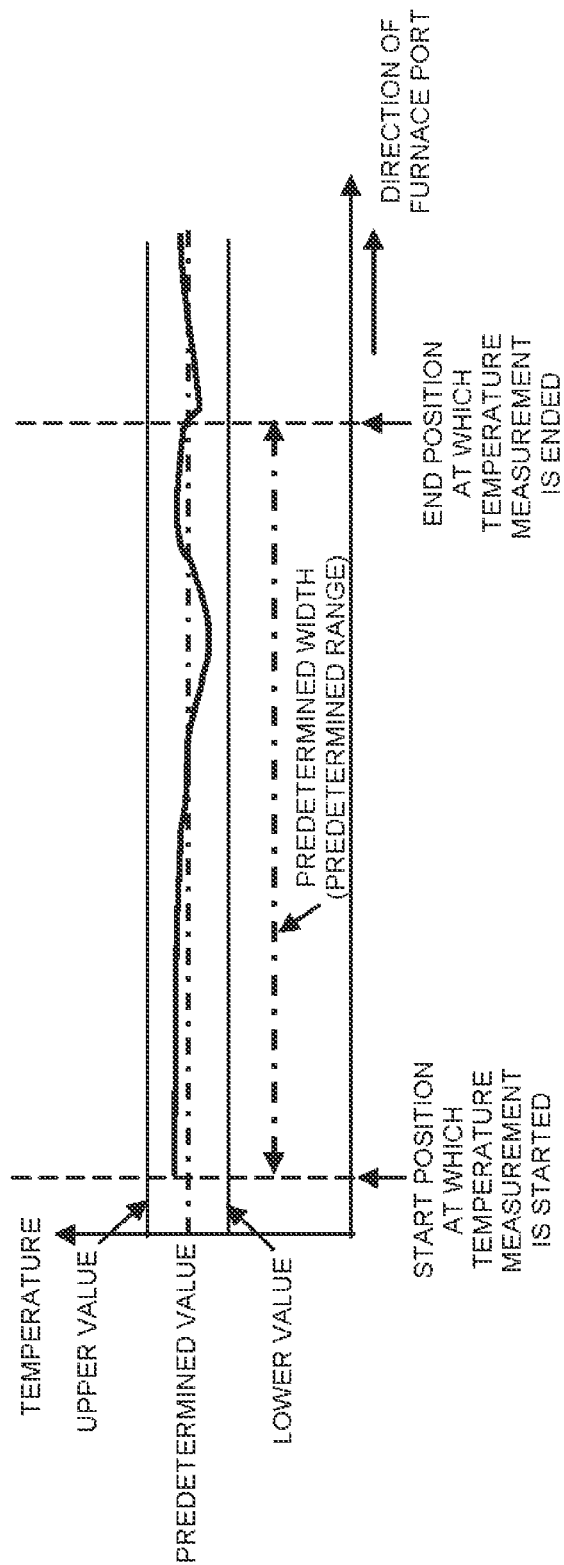

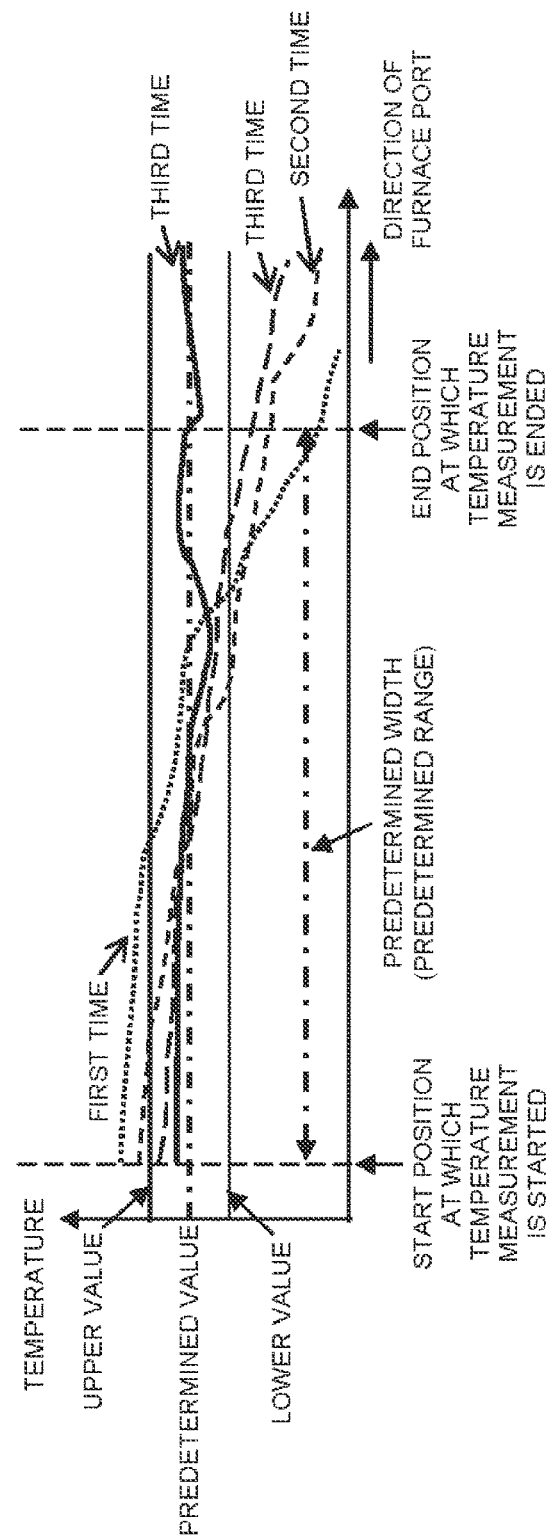

SUBSTRATE PROCESSING APPARATUS, METHOD OF MEASURING TEMPERATURE OF SUBSTRATE PROCESSING APPARATUS AND NON-TRANSITORY COMPUTER-READABLE RECORDING MEDIUM

CROSS-REFERENCE TO RELATED PATENT APPLICATION

This application is a continuation of International Application No. PCT/JP2013/064380, filed on May 23, 2013, entitled "Substrate Treatment Device, Temperature Measurement System, Method for Measuring Temperature of Treatment Device, Transportation Device, and Memory Medium," which claims priority under 35 U.S.C. § 119 to Application No. JP 2012-121203 filed on May 28, 2012, entitled "Substrate Treatment Device, Temperature Measurement System, Method for Measuring Temperature of Treatment Device, Transportation Device, and Memory Medium," the entire contents of which are hereby incorporated by reference.

FIELD OF THE INVENTION

The present invention relates to a substrate processing apparatus, a temperature measuring system, a method of measuring a temperature of a substrate processing apparatus, a transfer device, and a non-transitory computer-readable recording medium. More particularly, the present invention relates to a substrate processing apparatus, a temperature measuring system, a method of measuring a temperature of a substrate processing apparatus, a transfer device, and a non-transitory computer-readable recording medium which are available for processing a substrate, for example, a semiconductor wafer (a wafer used to manufacture a semiconductor integrated circuit apparatus) and a glass substrate (a substrate used to manufacture a liquid crystal display apparatus).

BACKGROUND

In a substrate processing apparatus according to the related art, the temperature of each of regions of a process furnace is measured. When, for example, components of a reaction furnace of the substrate processing apparatus are replaced with new components, a temperature-flat zone in the process furnace changes. Thus, a method of compensating for a change in temperature of the inside of the process furnace by measuring the inside temperature of the process furnace is performed. The method of compensating for a change in temperature of the inside of the process furnace by measuring the inside temperature of the process furnace may also be performed when, for example, the substrate processing apparatus is first driven. When the method of compensating for a change in temperature of the inside of the process furnace is performed, the following work is conventionally performed. First, an operator individually prepares a temperature measurement lifting fixture (auto-profiler), attaches a temperature measuring device to a vertical (upward/downward) movement unit of the fixture, accesses a data logger (electronic measuring machine) and a personal computer, and obtains temperature data regarding a heater temperature-flat zone of a process furnace when the inside temperature of the process furnace is increased. The operator calculates a temperature correction value based on the temperature data. However, the operator has to individually prepare the auto-profiler each time, thereby increasing costs and lowering workability. Also, even if a temperature correction value is calculated using the same device, the temperature correction value may vary according to an operator's skill and thus the performance or quality of a product is not uniform. Thus, research has been conducted on a method of obtaining temperature data regarding a heater temperature-flat zone in a process furnace without using the auto-profiler (see, for example, Japanese Unexamined Patent Application Publication No. H9-5172 (JP Application '5172)).

Although JP Application '5172 discloses measuring a temperature-flat length of a heater using a transfer device instead of a fixture such as an auto-profiler, a method of attaching a temperature measuring device (thermocouple) to the transfer device or a method of setting the temperature measuring device (thermocouple) at a measurement start position is not actually disclosed in JP Application '5172. According to JP Application '5172, variations occur when individual operators set the temperature measuring device at the measurement start position and workability varies according to the operators' skill. Thus, a variation occurs in a point at which a temperature-flat length of a heater is measured according to operators' skills, and thus the reliability of temperature control performance or the quality of a substrate is eventually likely to be lowered.

SUMMARY

It is a main object of the present invention to provide a substrate processing apparatus, a temperature measuring system, a method of measuring a temperature of a substrate processing apparatus, a transfer device, and a non-transitory computer-readable recording medium, which are capable of improving the workability of measuring a temperature-flat zone in a process furnace and the reliability of a temperature-flat length of a heater, regardless of an operator's skill.

According to one aspect of the present invention, there is provided a substrate processing apparatus including: a process chamber configured to process a substrate retained in a retainer loaded therein; a temperature measuring device configured to measure an inside temperature of the process chamber; a transfer device configured to transfer the substrate at least to the retainer; and a controller configured to control the transfer device and the temperature measuring device to move the transfer device to a predetermined position before the inside temperature of the process chamber is measured and to obtain the inside temperature by the temperature measuring device while vertically moving the transfer device with the temperature measuring device attached to the transfer device when the inside temperature of the process chamber is measured.

According to another aspect of the present invention, there is provided a temperature measuring system including: a temperature measuring device configured to measure an inside temperature of a process chamber processing a target object to be processed; a transfer device configured to transfer the target object; a fixture configured to attach the temperature measuring device to the transfer device; and a controller configured to control the temperature measuring device and the transfer device to obtain the inside temperature using the temperature measuring device by moving the transfer device with the temperature measuring device attached to the transfer device via the fixture.

According to another aspect of the present invention, there is provided a temperature measuring method, performed in a processing apparatus including a temperature measuring device configured to measure an inside temperature of a process chamber processing a target object to be processed, a transfer device configured to transfer the target object and a controller connected to the temperature measuring device and the transfer device and configured to control the transfer device and the temperature measuring device, the temperature measuring method including: moving the transfer device to a predetermined position before the inside temperature of the process chamber is measured; and obtaining the inside temperature by the temperature measuring device while moving the transfer device with the temperature measuring device attached to the transfer device when the inside temperature of the process chamber is measured.

According to another aspect of the present invention, there is provided a transfer device that is vertically movable while a temperature measuring device configured to measure an inside temperature of a process chamber processing a target object to be processed is attached to the transfer device, the transfer device including: a fixed fixture configured to attach the temperature measuring device thereto; and a sensor configured to sense whether a temperature measuring device support mechanism installed to be attachable to and detachable from the fixed fixture is attached to or detached from the fixed fixture.

According to another aspect of the present invention, there is provided a non-transitory computer-readable recording medium having recorded thereon a program at least including a sequence of measuring an inside temperature of a process chamber using a temperature measuring device attached to a transfer device, wherein the program includes: a sequence of moving the transfer device to a predetermined position; and a sequence of obtaining the inside temperature by the temperature measuring device while moving the transfer device with the temperature measuring device attached to the transfer device.

BRIEF DESCRIPTION OF THE DRAWINGS

FIGS. 4A and 4B illustrate states in which a temperature measuring device support mechanism is accommodated according to a first embodiment of the present invention, in which FIG. 4A is a side view and FIG. 4B is a plane view;

FIGS. 5A and 5B illustrate a protruding state of the temperature measuring device support mechanism according to the first embodiment of the present invention, in which FIG. 5A is a side view and FIG. 5B is a plane view;

FIGS. 6A and 6B illustrate a temperature measuring device attachment mechanism, in which FIG. 6A is a partially cut side view of the temperature measuring device attachment mechanism and FIG. 6B is a side view of the temperature measuring device attachment mechanism when it is attached;

FIGS. 10A and 10B illustrate the structure of the temperature measuring device support mechanism according to the second embodiment of the present invention;

FIG. 11 illustrates a structure for measuring a temperature-flat length in a process furnace according to a second embodiment of the present invention;

FIG. 15 is a graph showing an example of a result of measuring a temperature of the inside of a process furnace according to the second embodiment of the present invention; and FIG. 16 is a graph showing another example of a result of measuring a temperature of the inside of a process furnace according to the second embodiment of the present invention.

DETAILED DESCRIPTION

A substrate processing apparatus according to an embodiment of the present invention is configured to process a semiconductor wafer to be processed and to form an oxide film, perform a diffusion treatment, or form a film on the semiconductor wafer. In the present invention, a semiconductor wafer (hereinafter referred to as a 'wafer') 200 serving as a substrate to be processed is manufactured using a semiconductor such as silicon, and a front opening unified pod (FOUP) 110 is used as a carrier (storage container) for accommodating and transferring the wafer 200.

Figure 1:
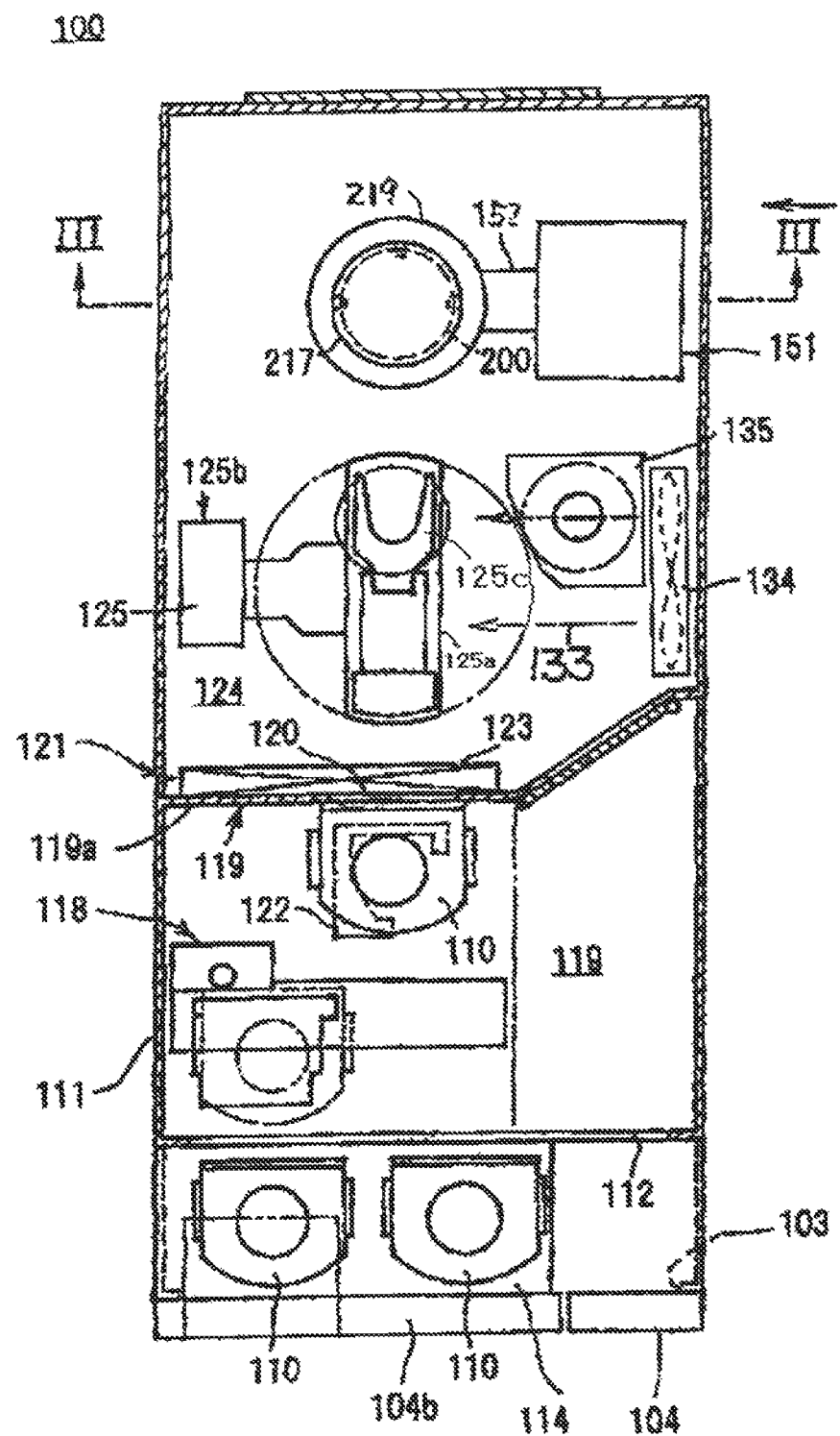
FIG. 1 is a schematic plan view of a substrate processing apparatus according to an embodiment of the present invention.
Figure 2:
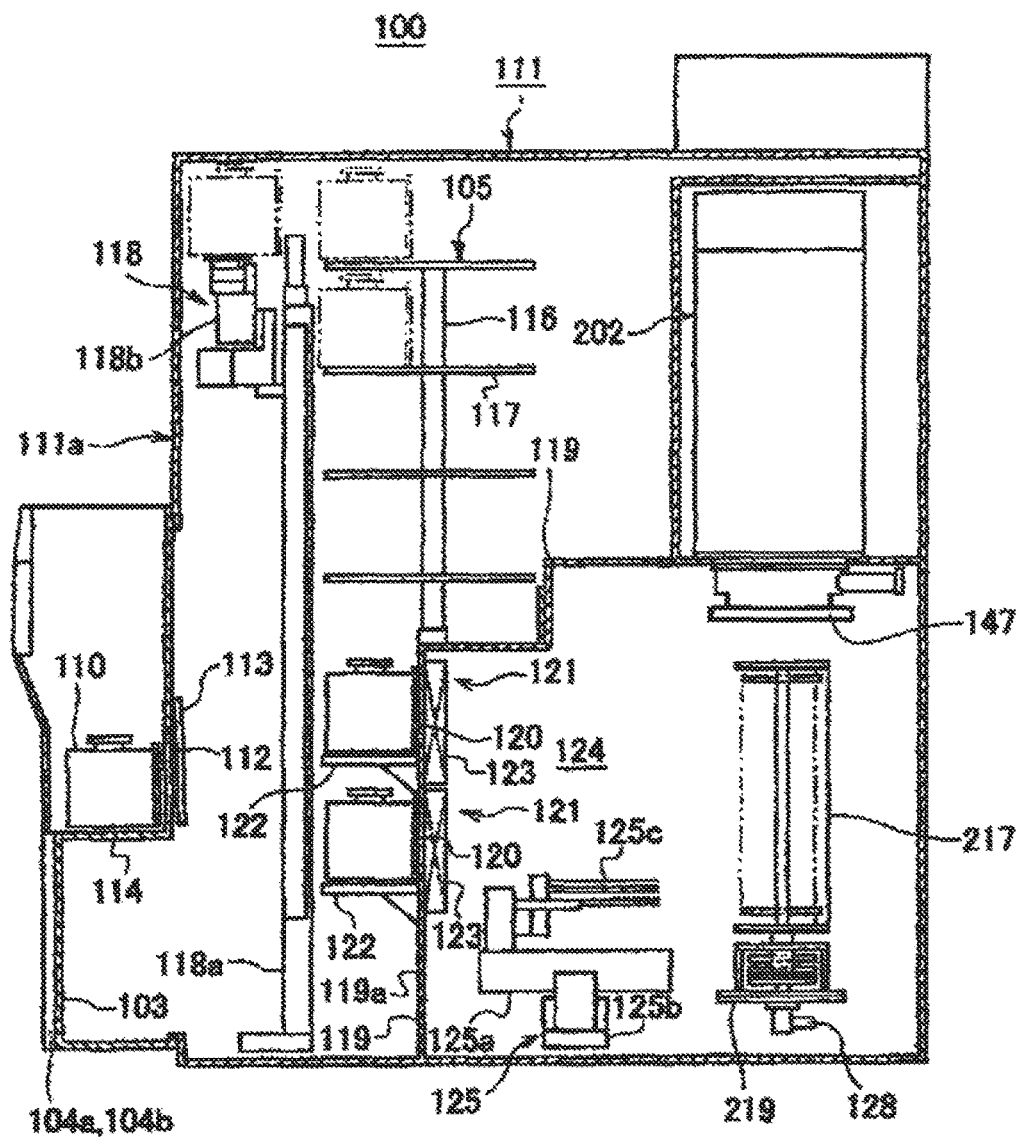
FIG. 2 is a schematic side view of a substrate processing apparatus according to an embodiment of the present invention.

As illustrated in FIGS. 1 and 2, a substrate processing apparatus 100 according to an embodiment of the present invention (hereinafter referred to as the 'processing apparatus 100') includes a housing 111. At a front of a front wall 111a of the housing 111, a front maintenance opening 103 is formed as an opening through which maintenance may be performed. Front maintenance doors 104 are installed to open/close the front maintenance opening 103. On the front wall 111a of the housing 111, a pod loading/unloading port (substrate storage container loading/unloading port) 112 configured to load/unload the FOUP (hereinafter referred to as the pod) 110 is installed to communicate with the inside/outside of the housing 111. The pod loading/unloading port 112 is configured to be opened/closed by a front shutter (substrate storage container loading/unloading port opening/closing mechanism) 113. A load port (substrate storage container receiving support) 114 is installed at the front of the pod loading/unloading port 112. The load port 114 is configured such that the pod 110 can be placed thereon so as to adjust position of the pod 110. The pod 110 is loaded on or unloaded from the load port 114 by an in-process transfer device (not shown).

A rotary receiving shelf (substrate storage container placing unit) 105 is installed upward on a roughly central portion between the front and back of the housing 111 to accommodate the pod 110. The substrate storage container placing shelf 105 is configured to accommodate a plurality of pods 110. That is, the substrate storage container placing shelf 105 is vertically installed, and includes a pillar 116 and a shelf board (substrate storage container placing supports) 117 of n stage installed on the pillar 116. Here, 'n' denotes an integer that is equal to or greater than 1. The two or more shelf boards 117 are configured to respectively support a plurality of pods 110 in a state in which the pods 110 are placed thereon. In the housing 111, a pod transfer device (substrate storage container transfer device) 118 is installed as a first transfer device between the load port 114 and the substrate storage container placing shelf 105. The pod transfer device 118 includes a pod elevator (substrate storage container going up/down mechanism) 118a that may be moved vertically while retaining the pod 110 therein, and a pod transfer mechanism (substrate storage container transfer mechanism) 118b serving as a transfer mechanism. The pod transfer device 118 is configured to transfer the pod 110 between the load port 114, the substrate storage container placing shelf 105 and a pair of pod openers (substrate storage container lid opening/closing mechanism) 121 through continuous operations of the pod elevator 118a and the pod transfer mechanism 118b.

The processing apparatus 100 includes a semiconductor manufacturing apparatus for performing a treatment, e.g., forming an oxide film. A sub-housing 119 forming a housing of the semiconductor manufacturing apparatus is installed at a lower portion in the housing 111, ranging from a roughly central portion between the front and back of the housing 111 to a rear end of the housing 111. A pair of wafer loading/unloading ports (substrate loading/unloading ports) 120 configured to transfer the wafer 200 inside/outside the sub-housing 119 are vertically installed on upper and lower terminates of a front wall 119a of the sub-housing 119. The pair of pod openers 121 are each installed at the wafer loading/unloading ports 120 on the upper and lower terminates of the front wall 119a. The pod openers 121 each include one of a pair of placing tables 122 on which the pod 110 is placed, and one of a pair of cap attaching/detaching mechanisms (lid attaching/detaching mechanisms) 123 for attaching/detaching a cap (lid) of the pod 110. Each of the pod openers 121 is configured to open/close a wafer entrance of the pod 110 by attaching/detaching the cap of the pod 110 placed on the placing table 122 with the cap attaching/detaching mechanism 123.

In the sub-housing 119, a transfer chamber 124 is formed to be fluidically insulated from a space in which the pod transfer device 118 or the substrate storage container placing shelf 105 is installed. A wafer transfer mechanism (substrate transfer mechanism) 125 is installed as a second transfer device in a front region of the transfer chamber 124. The wafer transfer mechanism 125 includes a wafer transfer device (substrate transfer device) 125a and a wafer transfer device elevator (substrate transfer device moving upward/downward mechanism) 125b. The wafer transfer device 125a supports the wafer 200 using tweezers (substrate retainer) 125c, and rotates the wafer 200 in a horizontal direction or linearly moves the wafer 200. The wafer transfer device elevator 125b moves the wafer transfer device 125a upward/downward. Through continuous operations of the wafer transfer device elevator 125b and the wafer transfer device 125a, the wafer transfer mechanism 125 charges a boat (substrate retainer) 217 serving as a unit for placing the wafer 200 thereon with the wafer 200 or discharges the wafer 200 from the boat 217 using the tweezers 125c of the wafer transfer device 125a.

As illustrated in FIG. 1, a clean unit 134 is installed at a right end of the transfer chamber 124 opposite the wafer transfer device elevator 125b. The clean unit 134 includes a supply fan and a dustproof filter, and supplies clean air 133 which is a clean atmosphere or an inert gas. A notch alignment device 135 serving as a substrate matching device for adjusting the location of the wafer 200 in a circumferential direction is installed between the wafer transfer device 125a and the clean unit 134.

The clean air 133 blown out of the clean unit 134 circulates around the notch alignment device 135 and the wafer transfer device 125a, is absorbed by a duct (not shown), is exhausted outside the housing 111 or circulates to a first side (supply side) which is an absorbing side of the clean unit 134, and is then blown out to the transfer chamber 124 again via the clean unit 134.

As illustrated in FIG. 1, a boat elevator (substrate retainer lifting mechanism) 151 is installed as a third transfer device in the transfer chamber 124. The boat elevator 151 is configured to move the boat 217 upward/downward. A seal cap 219 is horizontally installed as a lid on an arm 152 serving as a connector connected to the boat elevator 151. The seal cap 219 is configured to vertically support the boat 217 so as to block a bottom end portion of the process furnace 202. The boat 217 includes a plurality of retaining members. The boat 217 is configured to horizontally retain a plurality of wafers 200 (e.g., about 50 to 125 wafers 200) in a state in which the wafers 200 are vertically arranged in a concentric form.

Next, an operation of the processing apparatus 100 which is a substrate processing process of performing a predetermined treatment on the wafer 200 will be described. As illustrated in FIGS. 1 and 2, when the pod 110 is provided to the load port 114, the pod loading/unloading port 112 is opened by the front shutter 113. Then, the pod 110 provided on the load port 114 is loaded into the housing 111 by the pod transfer device 118 via the pod loading/unloading port 112. The pod 110 loaded into the housing 111 is automatically transferred, received and temporarily stored on a predetermined shelf board 117 of the substrate storage container placing shelf 105 through the pod transfer device 118. Then, the pod 110 is carried to one of the pod openers 121 from the shelf board 117 and then transferred to the placing table 122, or is directly carried to the pod opener 121 to be transferred to the placing table 122. In this case, the wafer loading/unloading port 120 of the pod opener 121 is closed by the cap attaching/detaching mechanism 123, and the clean air 133 circulates in the transfer chamber 124 to fill the transfer chamber 124 with the clean air 133. For example, the concentration of oxygen in the transfer chamber 124 is set to be, for example, 20 ppm or less by filling the inside of the transfer chamber 124 with nitrogen gas as the clean air 133, so that the concentration of oxygen in the transfer chamber 124 may be far less than the concentration of oxygen in (an atmosphere in) the housing 111.

When an end surface of the pod 110 placed on the placing table 122 facing an opening is pressurized onto an edge portion of the wafer loading/unloading port 120 near the opening at the front wall 119a of the sub-housing 119, the cap of the pod 110 is removed by the cap attaching/detaching mechanism 123 to open the wafer entrance of the pod 110. Then, the wafer 200 is picked up from the inside of the pod 110 via the wafer entrance by the tweezers 125c of the wafer transfer device 125a, rearranged by the notch alignment device 135, and then transferred to the boat 217 to be loaded (charged) into the boat 217. The wafer transfer device 125a transferring the wafer 200 into the boat 217 returns to the pod 110 so as to load a next wafer 200 into the boat 217.

While the wafer 200 is loaded into the boat 217 by the wafer transfer mechanism 125 using one of the pod openers 121 (the pod opener 121 on the upper or lower end of the front wall 119a), another pod 110 is transferred to the other pod opener 121 from the substrate storage container placing shelf 105 or the load port 114 by the pod transfer device 118 and is opened by the other pod opener 121.

When a predetermined number of the wafers 200 are loaded into the boat 217, the lower end portion of the process furnace 202 is opened by a furnace port gate valve 147. Then, the seal cap 219 is moved upward by a lifting platform of the boat elevator 151, and the boat 217 supported on the seal cap 219 is loaded into the process furnace 202.

After the loading of the boat 217, the wafer 200 is processed in the process furnace 202. After the wafer 200 is processed in the process furnace 202, the boat is unloaded from the process furnace 202 through the boat elevator 151. Thereafter, the wafer 200 and the pod 110 are unloaded from the housing 111 in an order substantially reverse to the above-described order, except for the wafer matching process performed by the notch alignment device 135.

Figure 3:
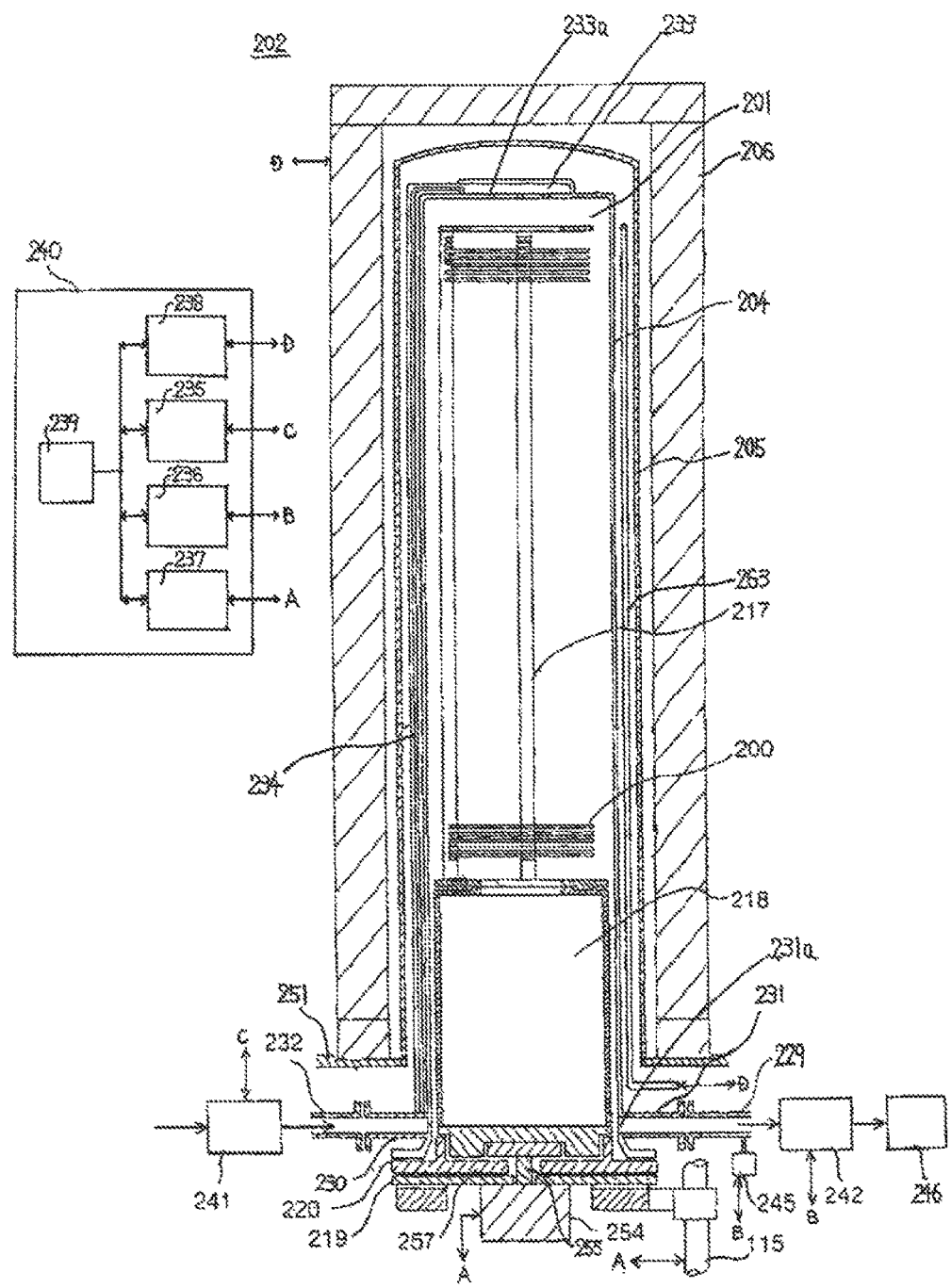
FIG. 3 is a longitudinal cross-sectional view of a process furnace of a substrate processing apparatus according to an embodiment of the present invention.

FIG. 3 is a schematic configuration diagram (a longitudinal cross-sectional view) of a process furnace 202 of a semiconductor manufacturing apparatus according to an embodiment of the present invention.

As illustrated in FIG. 3, the process furnace 202 includes a heater 206 serving as a heating mechanism. The heater 206 has a cylindrical shape and is vertically installed by being supported by a heater base 251 as a retainer plate.

In the heater 206, a temperature-flat tube (outer tube) 205 is installed concentrically with the heater 206. The temperature-flat tube 205 is formed of a heat-resistant material such as silicon carbide (SiC), and has a cylindrical shape, the top end of which is closed and the bottom end of which is open. In the temperature-flat tube 205, a reaction tube (inner tube) 204 is installed concentrically with the temperature-flat tube 205. The reaction tube 204 is formed of a heat-resistant material such as quartz (SiO2), and has a cylindrical shape, the top end of which is closed and the bottom end of which is open. A process chamber 201 is formed in a hollow tubular portion of the reaction tube 204. The process chamber 201 is configured to vertically accommodate a plurality of the wafers 200 in multiple stages in such a manner that the wafers 200 are arranged in a horizontal posture using the boat 217.

A gas introduction unit 230 is installed at a lower end portion of the reaction tube 204, and a fine pipe 234 serving as a gas introduction pipe is installed along an outer wall of the reaction tube 204 to a ceiling portion 233 of the reaction tube 204 through the gas introduction unit 230. A gas introduced via the gas introduction unit 230 circulates through the fine pipe 234 to reach the ceiling portion 233, and is then introduced into the process chamber 201 via a plurality of gas introduction holes 233a formed in the ceiling portion 233. Also, a gas exhaust unit 231 is formed on a position on the lower end portion of the reaction tube 204 on which the gas introduction unit 230 is installed so as to exhaust an atmosphere in the reaction tube 204 via an exhaust port 231a.

A gas supply pipe 232 is connected to the gas introduction unit 230. Although not shown, a process gas source, a carrier gas source and an inert gas source are connected to an upstream side of the gas supply pipe 232 opposite a side of the gas supply pipe 232 connected to the gas introduction unit 230 via a mass flow controller (MFC) 241 serving as a gas flow rate controller. A gas flow rate controller 235 is electrically connected to the MFC 241 so as to control the flow rate of a gas, which is to be supplied, to be equal to a desired flow rate at a desired timing. Also, when vapor needs to be supplied into the process chamber 201, a vapor generation device (not shown) is installed at the gas supply pipe 232 at a downstream side of the MFC 241.

A gas exhaust pipe 229 is connected to the gas exhaust unit 231. An exhaust device 246 is connected to a downstream side of the gas exhaust pipe 229 opposite a side of the gas exhaust pipe 229 connected to the gas exhaust unit 231 via a pressure sensor 245 serving as a pressure detector and a pressure adjustment device 242, and is configured to exhaust the process chamber 201 such that pressure in the process chamber 201 becomes equal to a predetermined pressure. A pressure controller 236 is electrically connected to the pressure adjustment device 242 and the pressure sensor 245. The pressure controller 236 is configured to control the pressure adjustment device 242 based on a pressure detected by the pressure sensor 245 so that the pressure in the process chamber 201 may become equal to a desired pressure at a desired timing.

At a lower end portion of the reaction tube 204, a base 257 serving as a retainer for air-tightly blocking a lower end opening in the reaction tube 204 and the seal cap 219 serving as a furnace port lid are installed. The seal cap 219 is formed of a metal such as stainless steel, and has a disc shape. The base 257 is formed of, for example, quartz, has a disc shape, and is installed on the seal cap 219. On a top surface of the base 257, an O-ring 220 is installed as a seal member that abuts the lower end of the reaction tube 204. A rotation mechanism 254 is installed at a side of the seal cap 219 opposite the process chamber 201 to rotate the boat 217. A rotation shaft 255 of the rotation mechanism 254 is connected to an insulating container 218 and the boat 217 while passing through the seal cap 219 and the base 257, and configured to rotate the insulating container 218 and the boat 217 so as to rotate the wafer 200. The seal cap 219 is configured to be moved vertically by the boat elevator 151 vertically installed as a moving upward/downward mechanism outside the process tube 203. By vertically moving the seal cap 219, the boat 217 may be transferred inside or outside the process chamber 201. A driving controller 237 is electrically connected to the rotation mechanism 254 and the boat elevator 151 to control them to perform a desired operation at a desired timing.

The boat 217 serving as a substrate retainer is formed of a heat-resistant material, e.g., quartz or silicon carbide, and configured to retain a plurality of the wafers 200 in such a manner that the wafers 200 are concentrically arranged in a horizontal posture. Below the boat 217, the insulating container 218 which is a cylindrical insulating member formed of a heat-resistant material such as quartz or silicon carbide is installed to support the boat 217, and configured to prevent heat generated from the heater 206 from being transferred to the lower end of the reaction tube 204.

A temperature sensor 263 serving as a temperature measuring device is installed between the temperature-flat tube 205 and the reaction tube 204. A temperature controller 238 is electrically connected to the heater 206 and the temperature sensor 263. The temperature controller 238 is configured to control the inside temperature of the process chamber 201 to have a desired temperature distribution at a desired timing by adjusting the amount of current to be supplied to the heater 206 based on temperature information detected by the temperature sensor 263.

The gas flow rate controller 235, the pressure controller 236, the driving controller 237 and the temperature controller 238 form a manipulation unit and an input/output (I/O) unit, and are electrically connected to a main controller 239 that controls the entire substrate processing apparatus 100. The gas flow rate controller 235, the pressure controller 236, the driving controller 237, the temperature controller 238 and the main controller 239 form a controller 240.

Next, a method of performing a treatment, such as oxidation or diffusion, on a wafer 200 using the process furnace 202 having the structure as described above will be described as a process included in a process of manufacturing a semiconductor device. In the following description, operations of various components of the processing apparatus 100 are controlled by the controller 240.

When a plurality of wafers 200 are loaded into the boat 217 (wafer charging), the boat 217 retaining the wafers 200 is lifted by the boat elevator 151 and is then loaded into the process chamber 201 (boat loading) as illustrated in FIG. 3. In this state, the lower end of the manifold 209 is hermetically sealed by the seal cap 219 via the base 257 and the O-ring 220b.

The inside of the process chamber 201 is exhausted by the exhaust device 246 to have a desired pressure. In this case, the pressure in the process chamber 201 is measured using the pressure sensor 245, and the pressure adjustment device 242 is feedback-controlled based on the measured pressure. Also, the inside of the process chamber 201 is heated to a desired temperature by the heater 206. In this case, the amount of current to be supplied to the heater 206 is feedback-controlled based on temperature information detected by the temperature sensor 263 so that the inside of the process chamber 201 has a desired temperature distribution. Then, the insulating container 218 and the boat 217 are rotated by the rotation mechanism 254 to rotate the wafer 200.

Then, a gas supplied from a process gas source and a carrier gas source and controlled to have a desired flow rate by the MFC 241 circulates through the gas introduction unit 230 and the fine pipe 234 via the gas supply pipe 232, reaches the ceiling portion 233, and is then introduced into the process chamber 201 in the form of a shower via the gas introduction holes 233a. The introduced gas flows down in the process chamber 201, circulates through the exhaust port 231a, and is then exhausted via the gas exhaust unit 231. When passing through the process chamber 201, the gas is in contact with a surface of the wafer 200 and causes a treatment such as oxidation or diffusion to be performed on the wafer 200. Also, when a treatment using vapor is performed on the wafer 200, a gas controlled to have a desired flow rate by the MFC 241 is supplied to the vapor generation device and a gas containing vapor (H2O) generated by the vapor generation device is introduced into the process chamber 201.

When a predetermined process time elapses, an inert gas is supplied from an inert gas source, and the pressure in the process chamber 201 is returned to normal pressure while an atmosphere in the process chamber 201 is replaced with the inert gas.

Then, the seal cap 219 is moved downward by the boat elevator 151 to open the lower end of the reaction tube 204 and to unload the processed wafers 200 from the lower end of the manifold 209 to the outside of the reaction tube 204 while the processed wafers 200 are retained on the boat 217 (boat unloading). Then, the processed wafers 200 are discharged by the boat 217 (wafer discharging).

As process conditions when, for example, oxidation is performed on a wafer in a process furnace according to the present invention, a processing temperature may be set to room temperature to 1,050° C., a process pressure may be set to 101,300 Pa or less, a gas type may be set to be H2O, and a gas supply flow rate may be set to 20 sccm. The wafer is processed by continuously maintaining the process conditions to be within the above ranges.

Figure 7:
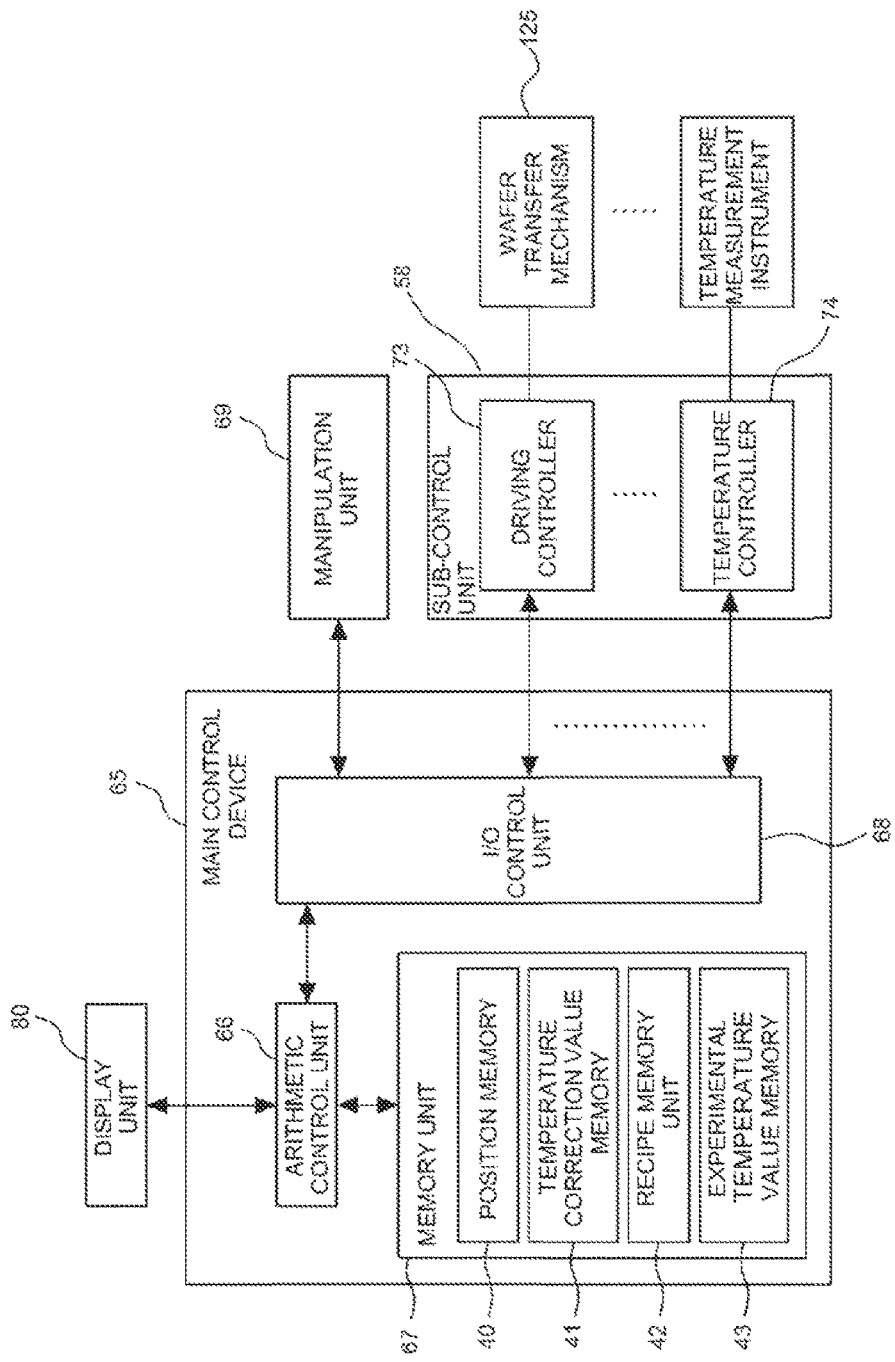
FIG. 7 is a block diagram of main components of a control device of a substrate processing apparatus according to an embodiment of the present invention

As illustrated in FIG. 7, a main control device 65 of the processing apparatus 100 according to the present invention includes an arithmetic control unit 66 such as a central processing unit (CPU), a memory unit 67 configured with a hard disk, etc., and an I/O control unit 68. A display unit 80, such as a display, a display panel, etc., is connected to the arithmetic control unit 66. A manipulation unit 69 and a sub-control unit 58 are connected to the I/O control unit 68. The arithmetic control unit 66 such as a CPU forms a hub of the main control device 65, executes a control program memorized in the memory unit 67, and executes various recipes (e.g., a process recipe) stored in the recipe memory unit 42 according to an instruction given from the display unit 80 which is a manipulation panel or the manipulation unit 69 which is a manipulation terminal. Here, the above described controller 240 includes at least the main control device 65 and the sub-control unit 58, and may further include the display unit 80 and the manipulation unit 69.

The sub-control unit 58 individually controls various controllers such as a driving controller 73 and a temperature controller 74. The various controllers are connected to the main control device 65 via the I/O control unit 68. Although not shown, the sub-control unit 58 may include the temperature controller 238, the gas flow rate controller 235, the pressure controller 236 and the driving controller 237 illustrated in FIG. 3. Also, the temperature controller 238 and the temperature controller 74 may be the same, and the driving controller 237 and the driving controller 73 may be the same. In particular, in the present disclosure, the sub-control unit 58 includes the driving controller 73, etc. that individually control a driver of the wafer transfer mechanism 125 (e.g., the wafer transfer device 125a or the wafer transfer device elevator 125b). The sub-control unit 58 feeds a state of a driver (a state in which the driver stands by, execution of an instruction given from the arithmetic control unit 66 is completed, etc. during the execution) back to the arithmetic control unit 66 and stores it as position memory 40, etc. in the memory unit 67 while driving the driver based on the instruction. Also, according to a measuring method of a temperature-flat length in a furnace which will be described below, the temperature controller 74 feeds a temperature (experimental value) measured by a temperature measuring device serving as a temperature sensor (such as a thermocouple) back to the arithmetic control unit 66 via the I/O control unit 68. When processing is performed by the arithmetic control unit 66, a result of performing processing is stored in the temperature correction value memory 41, etc.

The memory unit 67 such as read-only memory (ROM) is a recording medium embodied as an EEPROM, a flash memory, a hard disk, etc., that is configured to memorize an operating program of a CPU, etc. The I/O control unit 68 such as a random access memory (RAM) functions as a work area of the CPU.

The manipulation unit 69 may be disposed at a position spaced from the processing apparatus 100. For example, when the substrate processing apparatus 100 is installed in a clean room, the manipulation unit 69 may be disposed in, for example, an office rather than in the clean room. Also, in the main control device 65, a port is installed as an attaching/detaching unit (not shown) for attaching/detaching a USB flash memory which is a recording medium such as an external recording medium.

The main control device 65 according to an embodiment of the present invention is not limited to a dedicated computer and may be configured as a general-purpose computer system. For example, the main control device 65 that performs the above-described processing may be configured by installing a program causing a general-purpose machine to perform the above-described processing from a recording medium (a flexible disk, a CD-ROM, a USB, etc.) storing the program.

Any arbitrary means may be used to provide such a program. Such a program may be provided via a predetermined recording medium as described above, and may also be provided, for example, via a communication line, a communication network, a communication system, etc. In this case, the program may be posted, for example, on a bulletin board of a communication network and provided by overlapping the program with a carrier wave via the communication network. The above-described processing may be performed by starting the provided program to be executed under control of an operating system (OS), similar to other applications.

In the following embodiments including a first embodiment, the above processing is performed using a substrate processing apparatus as described above with reference to FIG. 1 or 2, a process furnace of a substrate processing apparatus as described above with reference to FIG. 3, and the main control device 65 of the substrate processing apparatus 100 described above with reference to FIG. 7. Accordingly, these components are not described in detail in the following embodiments.

First Embodiment

A temperature measuring device support mechanism 10 illustrated in FIGS. 4A to 6B will be described below. The temperature measuring device support mechanism 10 serving as a fixture for attaching a temperature measuring device 18 is installed on the wafer transfer mechanism 125. The temperature measuring device support mechanism 10 includes a wafer transfer mechanism connection arm (also referred to hereinafter as a 'first arm') 11 and a temperature measuring device support arm (also referred to hereinafter as a 'second arm') 12. The first arm 11 is supported in such a manner that one end portion thereof is rotatable through a pivot 11a of the wafer transfer device 125a. The second arm 12 is connected to another end portion of the first arm 11 in such a manner that one end portion thereof is rotatable through a pivot 12a. From the wafer transfer device 125a, a pair of arm receivers 13A and 13B protrude at a position near the pivot 11a (also referred to hereinafter as a 'front position') and a position spaced by about the length of the first arm 11 from the pivot 11a (also referred to hereinafter as a 'rear position'), respectively. Top surfaces of the pair of arm receivers 13A and 13B abut a bottom surface of the first arm 11 to horizontally support the first arm 11 at the front position and the rear position, respectively. The first arm 11 is accommodated at a side of the wafer transfer device 125a when the first arm 11 is horizontally supported by the arm receiver 13B at the rear position (see FIGS. 4A and 4B), and protrudes from the wafer transfer device 125a when the first arm 11 is supported by the arm receiver 13A at the front position (see FIGS. 5A and 5B). A support shaft 14 horizontally supporting the second arm 12 is installed around the pivot 12a of the second arm 12. The support shaft 14 allows the second arm 12 to make a reciprocal movement about the first arm 11 while rotating 180°, and supports the second arm 12 horizontally at each of the front position and the rear position of the first arm 11. The second arm 12 that is parallel to the first arm 11 at the rear position is accommodated on the wafer transfer device 125a (see FIGS. 4A and 4B), and the second arm 12 that is parallel to the first arm 11 at the front position protrudes from the wafer transfer device 125a (see FIGS. 5A and 5B).

Figure 6A:
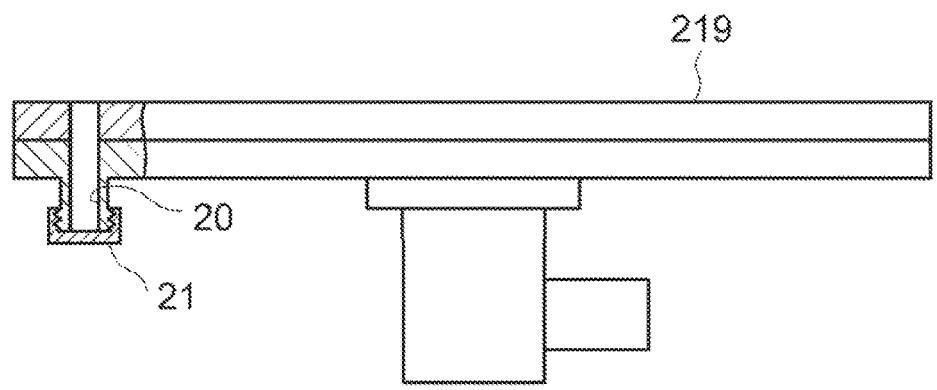
Figure 6B:
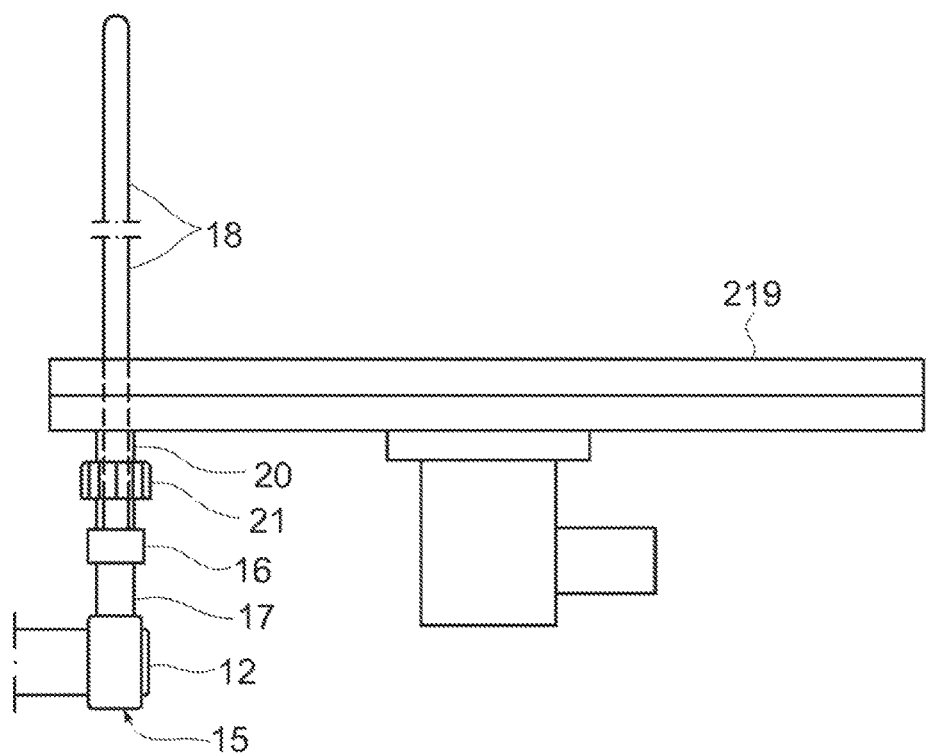

A temperature measuring device support unit (hereinafter referred to as a 'support unit') 15 is installed on a free end portion of the second arm 12. The support unit 15 is configured to support the temperature measuring device 18 to be attachable/detachable using a clamp screw 16 and a fixed spring 17. As illustrated in FIGS. 6A and 6B, a temperature measuring device insertion hole (hereinafter referred to as 'insertion hole') 20 into which the temperature measuring device 18 is inserted is formed in the seal cap 219. An ultra-torr nut 21 is screwed into the insertion hole 20. The insertion hole 20 is configured to be opened or closed by the ultra-torr nut 21. While the ultra-torr nut 21 is loosened from the insertion hole 20, the temperature measuring device 18 is inserted into the second arm 12 vertically from below by the temperature measuring device support mechanism 10. In this case, since the temperature measuring device support mechanism 10 is moved by the wafer transfer device elevator 125b of the wafer transfer mechanism 125 in a vertical direction (perpendicular to the seal cap 219), the temperature measuring device 18 may be appropriately inserted into the insertion hole 20.

Figure 4A:
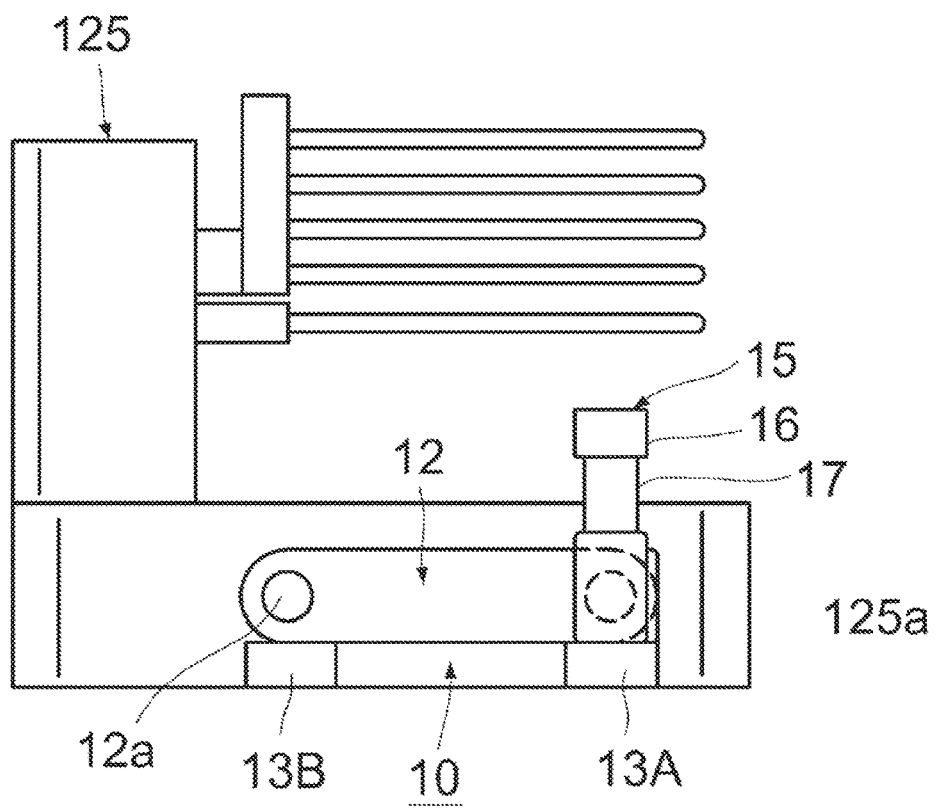
Figure 4B:
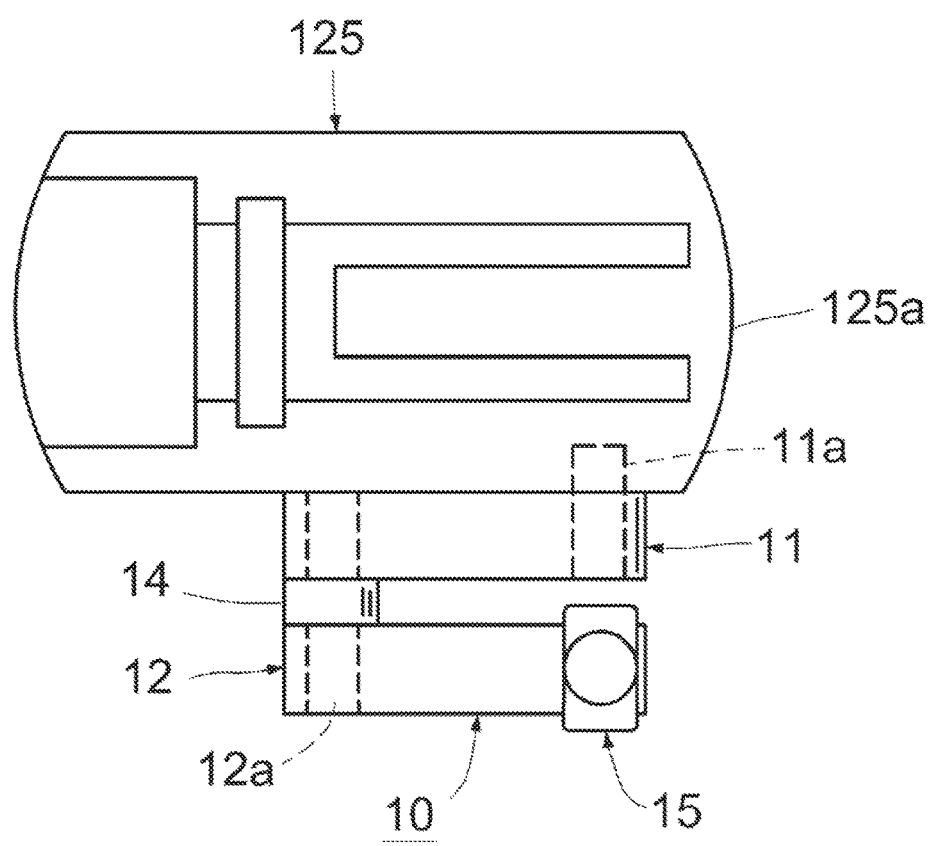

Also, when a process included in a method of manufacturing a semiconductor device as described above is performed, the temperature measuring device support mechanism 10 is maintained to be accommodated as illustrated in FIGS. 4A and 4B. That is, the first arm 11 is supported horizontally on the arm receiver 13B at the rear position, and the second arm 12 is supported horizontally at the rear position by the support shaft 14. Thus, the temperature measuring device support mechanism 10 does not interfere with performing of the method of manufacturing a semiconductor device.

Next, a method of correcting temperature data of a temperature-flat zone in a process furnace will be described with reference to FIG. 8, etc. For example, when the reaction tube 204 of the processing apparatus 100 is replaced with a new reaction tube, a temperature-flat zone changes in the process furnace 202. Thus, a temperature-flat zone in the process furnace 202 should be measured again and a method of correcting temperature should be performed.

Before performing a method of correcting temperature of the inside of a process chamber as will be described below, for example, when a reaction tube is replaced with a new reaction tube, a position of the temperature measuring device support mechanism 10 is defined such that a support unit of the temperature measuring device support mechanism 10 is disposed right below an insertion port for inserting the temperature measuring device 18, and stored as the position memory 40 in the memory unit 67 (step A1). The position of the temperature measuring device support mechanism 10 may be defined using a value of an encoder (position detector) of a rotary shaft (turn shaft) of the wafer transfer device 125a of the wafer transfer mechanism 125 and a value of an encoder of moving upward/downward shaft (lifting shaft) of the wafer transfer device elevator 125b.

Figure 5A:
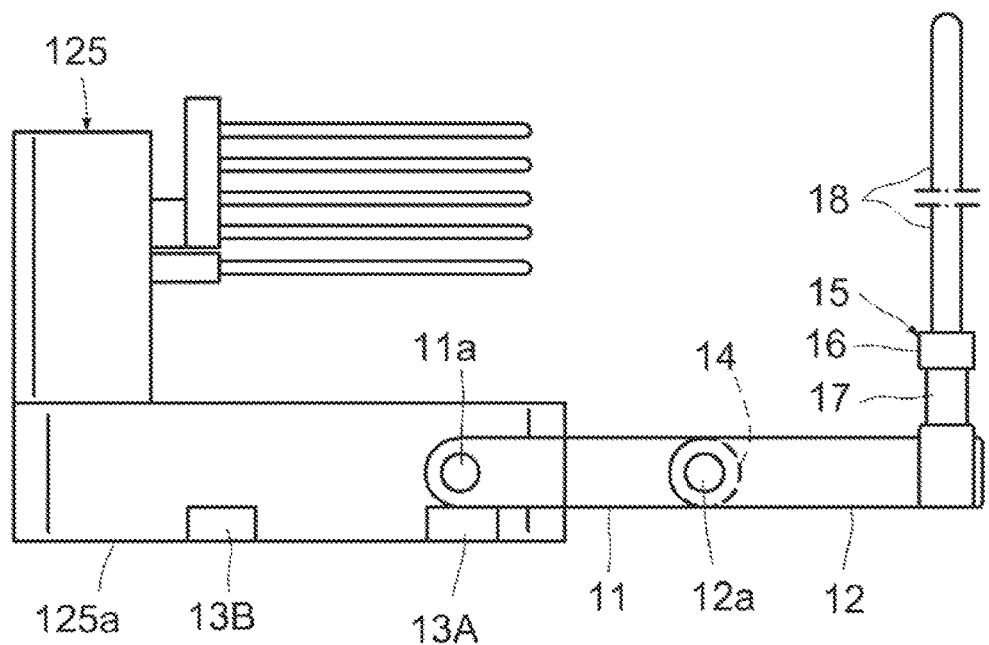
Figure 5B:
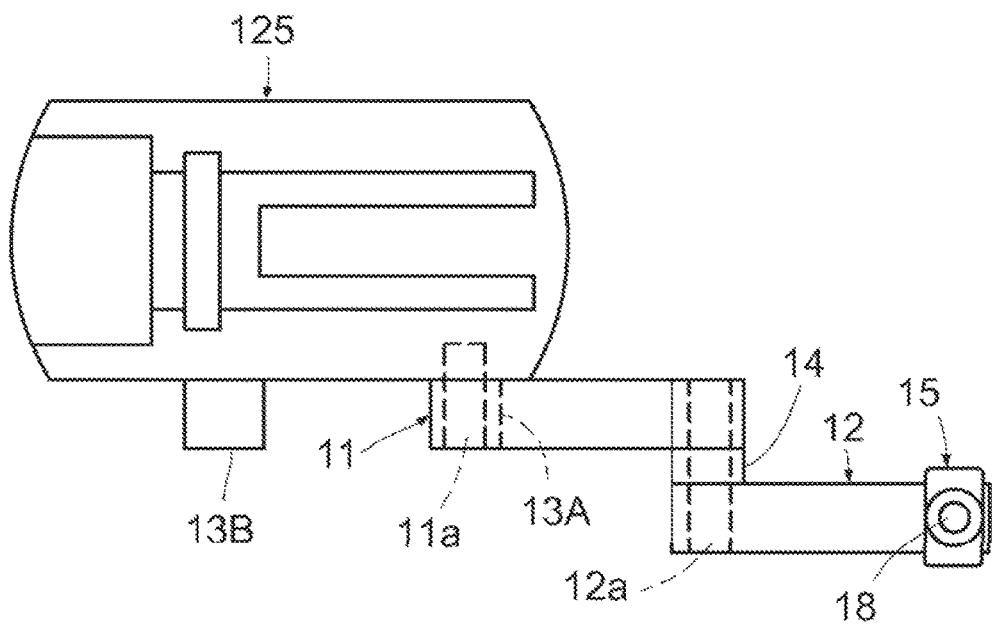

If the method of correcting an inside temperature of a process chamber needs to be performed, for example, when a reaction tube is replaced with a new reaction tube, the temperature measuring device support mechanism 10 is switched from an accommodated state illustrated in FIGS. 4A and 4B to a protruding state illustrated in FIGS. 5A and 5B. That is, the first arm 11 is moved upward while rotating 180° to be horizontally supported by the arm receiver 13A at the front position. At the same time, the second arm 12 is also moved while rotating 180° to be horizontally supported by the support shaft 14 at the front position. The temperature measuring device 18 is attached to the support unit 15 of a front end portion of the protruding second arm 12 via the clamp screw 16 and the fixed spring 17 to be detachable from the support unit 15 (see FIGS. 5A and 5B). The insertion hole 20 of the seal cap 219 is opened by the ultra-torr nut 21. The temperature measuring device support mechanism 10 is transferred right below the insertion hole 20 of the seal cap 219, based on the position memory 40 that has been set beforehand and stored in the memory unit 60. Then, the temperature measuring device 18 is inserted into the insertion hole 20 by moving the temperature measuring device support mechanism 10 upward by the wafer transfer device elevator 125b, as illustrated in FIG. 6B. Also, the seal cap 219 is moved upward by the boat elevator 151 and the lower end portion of the process furnace 202 is thus blocked by the seal cap 219. Also, in general, although a substrate need not be loaded in the boat 217 lifted by the boat elevator 151, dummy substrates are loaded in the boat 217 beforehand for an actual substrate processing process. Also, after a lower end portion of the process furnace 202 is blocked by the seal cap 219, the insertion hole 20 of the seal cap 219 is preferably opened by loosening the ultra-torr nut 21, and the temperature measuring device 18 is preferably attached to the support unit 15 while the temperature measuring device 18 is inserted into the insertion hole 20 (step A2).

Next, the inside of the process furnace 202 is heated to a predetermined temperature by the heater 206, and the process furnace 202 stands by until the inside of the process furnace 202 is stabilized at the predetermined temperature (step A3). After the inside temperature of the process furnace 202 is stabilized, the inside temperature of the process furnace 202 is measured using the temperature measuring device 18 inserted into the process furnace 202. That is, temperature of a temperature-flat zone of the heater 206 is measured by moving the temperature measuring device 18 attached to the temperature measuring device support mechanism 10 downward by the wafer transfer device elevator 125b. The temperature-flat zone is detected using the manipulation unit 69 and an individual manipulation terminal (step A4). An operator calculates a temperature correction value based on obtained temperature data and stores it in a temperature correction value memory 41 in the memory unit 67. Here, a temperature correction value may be automatically calculated based on temperature data obtained by the arithmetic control unit 66 and stored in the temperature correction value memory 41 (step A5). A temperature-flat zone of the heater 206 in the process furnace 202 is detected again. That is, the temperature measuring device 18 attached to the temperature measuring device support mechanism 10 is moved upward by the wafer transfer device elevator 125b, stabilized at a predetermined temperature, and moved downward by the wafer transfer device elevator 125b so as to measure a temperature of a temperature-flat zone of the heater 206 (step A6). Temperature data is repeatedly obtained by the arithmetic control unit 66 a plurality of times until temperatures (flat temperatures) of the temperature-flat zone of the heater 206 obtained as described above are within a predetermined value range (step A7). When the flat temperatures are within the predetermined value range, the calculation of the temperature correction value is completed.

The following effects can be achieved according to the first embodiment.

(1) Since an auto-profiler need not be individually prepared, the workability of a method of correcting a temperature of the inside of a process furnace may be improved and costs may be lowered.

(2) By using an elevator of a wafer transfer mechanism, determination of a position of a temperature measuring device support mechanism (position definition) may be simplified, and a start position at which a temperature-flat length in the process furnace is measured may be fixed.

(3) By installing the temperature measuring device support mechanism to be accommodated in a wafer transfer mechanism, the temperature measuring device support mechanism may be prevented from interfering with a transfer work performed by a wafer transfer mechanism when a temperature-flat length is not measured in the process furnace.

(4) Since a main control device or a manipulation unit and an individual manipulation terminal of a processing apparatus are used, data of a temperature-flat zone in the process furnace may be obtained and stored in a memory unit of the main control device. Also, a position to which each wafer (a product wafer, a dummy wafer, a fill dummy wafer, etc.) is to be transferred or a temperature correction value may be calculated using an arithmetic control unit and stored. Thus, matters such as the position to which each wafer is to be transferred, the number of wafers, the temperature correction value, and the like, which should be manually input by an operator, may be reduced, and a data logger or a PC need not be prepared.

(5) Since various operations may be automatically performed, a start position of measurement of a temperature-flat length region may be determined and the reliability of a range of measuring the temperature-flat length region may be improved (i.e., a variation in the range of measurement may be greatly reduced) regardless of an operator's skill. Accordingly, the performance of temperature control or the quality of a substrate to be processed may be maintained constant.

(6) Since various operations may be automatically performed, a work may be performed while the door of a transfer chamber is closed and an operator need not enter the transfer chamber, thereby guaranteeing the safety of the operator.

(7) Data of a temperature-flat zone in the process furnace may be obtained in real time. Also, a position to which each of wafers (a product wafer, a dummy wafer, a fill dummy wafer, etc.) is to be transferred or obtained data may be stored in the memory unit 67 of the main control device 65. Also, a temperature correction value of the inside of the process may be calculated using the arithmetic control unit 66 and automatically stored, similar to the obtained data (experimental value). Accordingly, a time needed to detect a temperature-flat zone in the process furnace may be decreased.

Second Embodiment

Although costs may be decreased by individually preparing an auto-profiler in the first embodiment, the temperature measuring device support mechanism 10 is fixed on the wafer transfer mechanism 125 and costs of the wafer transfer mechanism 125 thus increase. That is, it is difficult to decrease manufacturing costs of the processing apparatus 100. Thus, in the present embodiment (second embodiment), a temperature measuring device support mechanism 10 is added as an option for a longitudinal apparatus and additionally improved without increasing a selling price of a product.

Figure 9A:
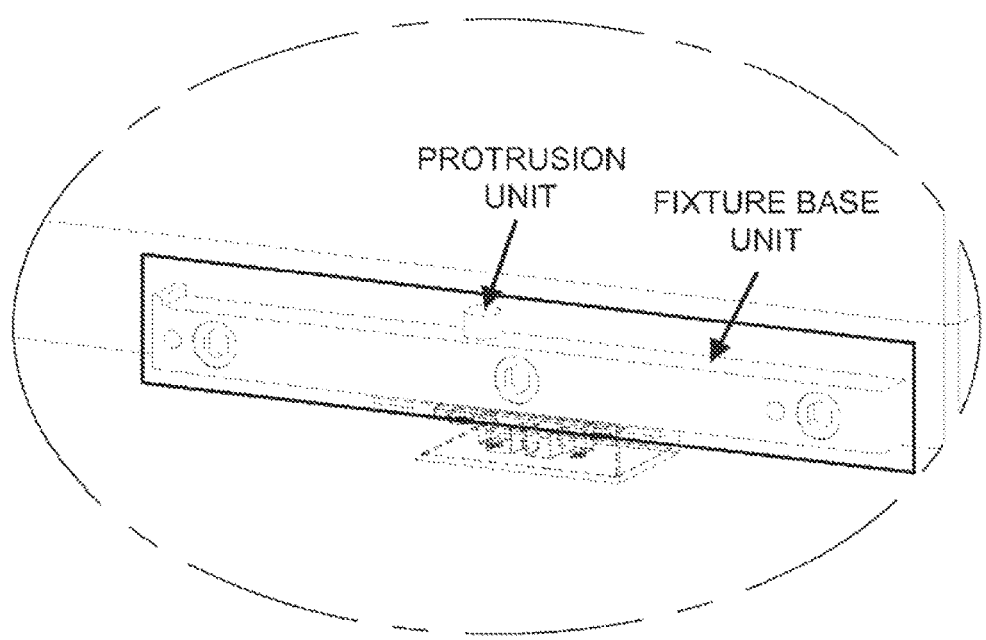
FIGS. 9A and 9B illustrate a fixture base unit configured to install a temperature measuring device support mechanism in a wafer transfer mechanism according to a second embodiment of the present invention.
Figure 9B:
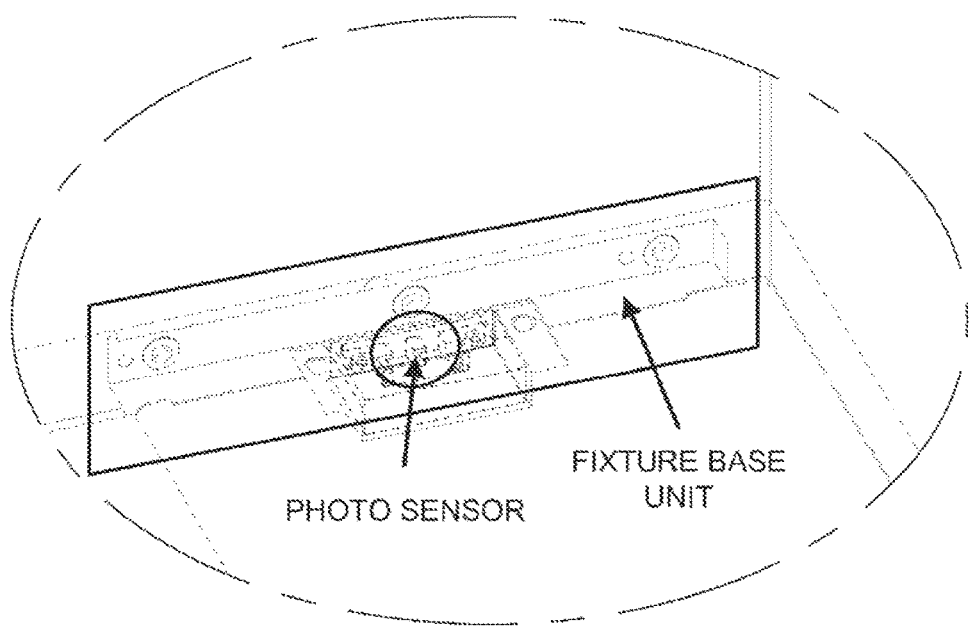

A temperature measuring device support mechanism 10 illustrated in FIGS. 9 and 10 will be described below. FIGS. 9A and 9B illustrate a state in which a fixture base unit is fixed as a fixed fixture on a wafer transfer mechanism 125 according to a second embodiment of the present invention. By permanently installing the fixture base unit on the wafer transfer mechanism 125 beforehand, the temperature measuring device support mechanism 10 may be attached to the wafer transfer mechanism 125 when needed. Also, a sensor is installed as a detector for detecting whether the temperature measuring device support mechanism 10 is present or not (attached to or detached from the wafer transfer mechanism 125). Thus, a main control device or a manipulation unit of the processing apparatus 100 may detect whether the temperature measuring device support mechanism 10 is present or not. Thus, an operator may detect whether the temperature measuring device support mechanism 10 is present or not while a door of the transfer chamber is closed without having to enter a transfer chamber. In this case, a fixture base unit does not interfere with transferring of a substrate using the wafer transfer mechanism 125. Due to the above structure, the temperature measuring device support mechanism 10 may be set as an option and manufacturing costs may thus be decreased. Also, in the second embodiment, the fixture base unit may be set to be a first fixture and the temperature measuring device support mechanism 10 may be set to be a second fixture.

FIG. 10 illustrates a structure of a temperature measuring tool as the above-described temperature measuring device support mechanism 10 attached to a fixture base unit. As illustrated in FIG. 10, the temperature measuring tool according to the present embodiment (second embodiment) includes a first arm, a slide guide, a second arm, a first base, a second base, a slide plate, a spring, a pillar, a pillar base and a quartz installation unit serving as the support unit 15.

The temperature measuring device 18 such as a quartz thermocouple (TC) is installed in the support unit 15 such as the quartz installation unit. Also, the first base and the second base function as fine adjustment mechanisms, the slide plate functions as a parallel transportation mechanism, and the spring functions as an eccentricity and declination mechanism. Due to the above functions, the temperature measuring device 18 installed in the support unit 15 may be prevented from being broken. Also, since a position into which the temperature measuring device 18 such as a quartz thermocouple (TC) is inserted varies according to the type of a device, the slide guide is installed between the first arm and the second arm so that the second arm has a stretchable structure. Thus, the length of the second arm may be adjusted. Also, the temperature measuring device support mechanism 10 is optional and is thus configured to be conveniently carried and stored. As described above, the temperature measuring device support mechanism 10 is not limited in terms of device specifications, an operation performed on a substrate (e.g., film type), etc., and may be configured to be attachable to the wafer transfer mechanism 125 via a fixture base unit.

FIG. 11 illustrates an operation of the wafer transfer mechanism 125 in the transfer chamber when a temperature-flat zone is measured in a process furnace according to the present embodiment (second embodiment).

First, the boat 217 is fully charged with substrates and boat loading is performed. In this case, dummy substrates are used to fully charge the boat 217 with a predetermined number of substrates, similar to a state in which substrate processing is performed. However, the present invention is not limited thereto. For example, the boat 217 may not be fully charged with substrates, there may be a gap between substrates, or boat loading may be performed without substrates.

Next, a quartz protective pipe is fixedly inserted into the process furnace. Then, the wafer transfer mechanism 125 is moved to a predetermined position, and the temperature measuring device support mechanism 10 is attached as a measuring tool to the wafer transfer mechanism 125. The temperature measuring device 18 is installed at the quartz installation unit of the temperature measuring device support mechanism 10 by inserting the temperature measuring device 18 such as a quartz thermocouple (TC) into the quartz protective pipe. Lastly, the temperature measuring device 18 is connected to a measuring machine of the processing apparatus 100.

A temperature-flat zone is measured in the process furnace by measuring temperature of a heater temperature-flat zone by moving the temperature measuring device 18 downward by the wafer transfer device elevator 125b when the inside of the process furnace is stabilized at a predetermined temperature. The temperature of the heater temperature-flat zone is repeatedly measured by moving the temperature measuring device 18 upward/downward to a measurement start position by the wafer transfer device elevator 125b until the measured temperature is within a predetermined value range.

Next, a temperature measuring method of temperature-flat zone in a process furnace according to the present embodiment (second embodiment) will be described in detail. First, an operator prepares a recipe for measuring a temperature-flat zone in the process furnace using the display unit 80 or the manipulation unit 69. The recipe for measuring a temperature-flat zone (hereinafter referred to as a 'temperature-flat length measuring recipe') is stored in the memory unit 67 of the main control device 65 beforehand.

Next, a process of measuring a temperature-flat zone in a process furnace by executing the temperature-flat length recipe will be described with reference to a flowchart of FIG. 12.

The temperature-flat length recipe is started by pressing a predetermined button of the manipulation unit 69. A number of times n that a temperature-flat length of a heater is measured and a counter i thereof are set. Although the number of times n is illustrated as "?" in the flowchart of FIG. 12, the number of times n is actually set to a predetermined threshold value (natural number) by an operator when the recipe is prepared.

Also, the wafer transfer mechanism 125 serving as a transfer machine is moved to a predetermined position and stands by until attachment of a desired fixture is completed. In detail, the wafer transfer mechanism 125 stands by until the temperature measuring device support mechanism 10 is attached to a fixture base unit fixed on the wafer transfer mechanism 125 and the temperature measuring device 18 is attached to the temperature measuring device support mechanism 10.

After the installation is completed, a comparison step is performed to compare the number of times n and the counter i with each other. Since the counter i is not greater than the number of times n, a subsequent step is performed to start measuring a temperature-flat length.

First, a movement step is performed to move to a start position at which measuring of a temperature-flat length is started. However, when execution of the temperature-flat length recipe is started, the wafer transfer mechanism 125 is moved near the start position and thus a subsequent position check process is immediately performed. Next, a position of each axis is checked, and the execution of the temperature-flat length recipe is terminated when a position error occurs. When a result of checking the position of each of the axes is satisfactory, a subsequent process of checking whether interference occurs is performed. Next, it is checked whether a position of a Z axis (operational shaft of the wafer transfer device elevator 125b) exceeds a predetermined furnace port shutter interference value. When an interference error occurs, the execution of the temperature-flat length recipe is terminated. When a result of checking the position of the Z axis is satisfactory, a subsequent step of checking a start position is performed. Next, it is checked whether the Z axis is positioned at the start position within a predetermined time (for example, 600 seconds). When the Z axis is unable to reach the start position within the predetermined time, a start-position timeout error occurs and thus the execution of the temperature-flat length recipe is terminated. When it is determined that the Z axis is positioned at the start position within the predetermined time, the moving of the temperature measuring device 18 to the start position is terminated.

Stabilization of the inside of the process furnace at a predetermined temperature is awaited.

After the inside of the process furnace is stabilized at the predetermined temperature, measuring of a temperature-flat length is started. Specifically, the wafer transfer device elevator 125b is moved downward to move the temperature measuring device 18 downward. By using the temperature measuring device 18, temperature of each measurement point in the process furnace is measured. In this case, temperature data is stored in an experimental temperature value memory 43 of the memory unit 67 of the main control device 65 using the temperature controller 74 as illustrated in FIG. 7.

The temperature-flat length is measured by measuring temperature of the inside of the process furnace while moving the temperature measuring device 18 downward until the temperature measuring device 18 is moved to an end position at which measuring of a temperature-flat length is terminated. Here, when it is determined that the temperature measuring device 18 is unable to reach the end position within a predetermined time, an end-position timeout error occurs and the execution of the temperature-flat length recipe is thus terminated. When it is determined that the temperature measuring device 18 is moved to the end position within the predetermined time, the measuring of the temperature-flat length is terminated. In this case, an operator calculates a temperature correction value based on obtained temperature data and stores it in the temperature correction value memory 41. Then, the temperature correction value is changed. Alternatively, the arithmetic control unit 66 may be configured to automatically calculate a temperature correction value based on obtained temperature data. Although not shown, a process of obtaining a temperature correction value may be performed after the temperature-flat length is measured. Also, the arithmetic control unit 66 may be configured to automatically calculate a temperature correction value from a temperature measured by the temperature measuring device while the transfer device is moved downward.

After the measuring of the temperature-flat length is terminated, the counter i for measuring a temperature-flat length is increased by '1.' Then, this fact is fed back to the comparison step and the counter i is compared with the number of times n.

When a comparison result reveals that the counter i is greater than the number of times n, the execution of the temperature-flat length recipe is terminated. When the counter i is not greater than the number of times n, a subsequent movement step is performed to measure the temperature-flat length again. When it is moved to the start position, the position of each of the axes is checked, it is checked whether interference occurs, and the start position is checked.

After the temperature-flat length is measured again, the counter i for measuring a temperature-flat length is increased by '1.' Then, this fact is fed back again to the comparison step and the counter i and the number of times n are compared with each other. When the counter i is equal to or greater than the number of times n, the execution of the temperature-flat length recipe is terminated.

Also, the position of each of the axes is continuously checked. Since the position of each of the axes is checked in a predetermined cycle (e.g., a one-second cycle), when an error occurs while the temperature measuring device 18 installed on the wafer transfer mechanism 125 via the fixture base unit is moved upward, the movement of the temperature measuring device 18 may be quickly stopped. Thus, it is possible to prevent quartz from being broken due to contact between the temperature measuring device 18 and the quartz protective pipe.

Also, according to the present embodiment, a plurality of temperature-flat length recipes may be executed. For example, the counter i for measuring a temperature-flat length and the number of times n may each be set to an appropriate value, and a temperature-flat length recipe A may be executed when a temperature-flat length is firstly measured, a temperature-flat length recipe B may be executed may be executed when the temperature-flat length is secondly measured, and a temperature-flat length recipe C may be executed when the temperature-flat length is thirdly measured so that different recipes may be executed according to conditions for measuring the process furnace. Otherwise, a recipe may be replaced with another recipe at predetermined intervals of time, e.g., the temperature-flat length recipe B may be executed when the temperature-flat length recipe A is repeatedly executed three times.

Figure 12:
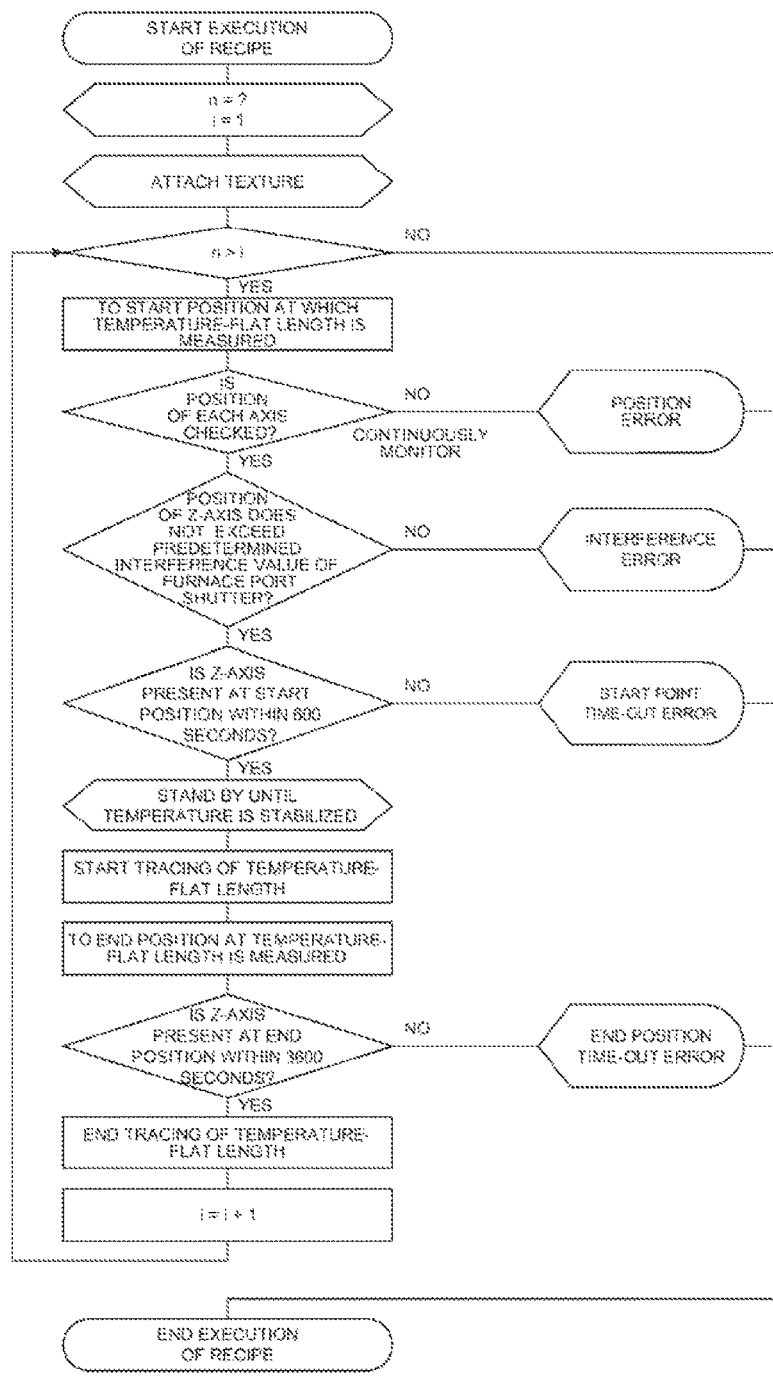
FIG. 12 is a flowchart of a method of correcting a temperature of the inside of a process furnace according to a second embodiment of the present invention.
Figure 13:
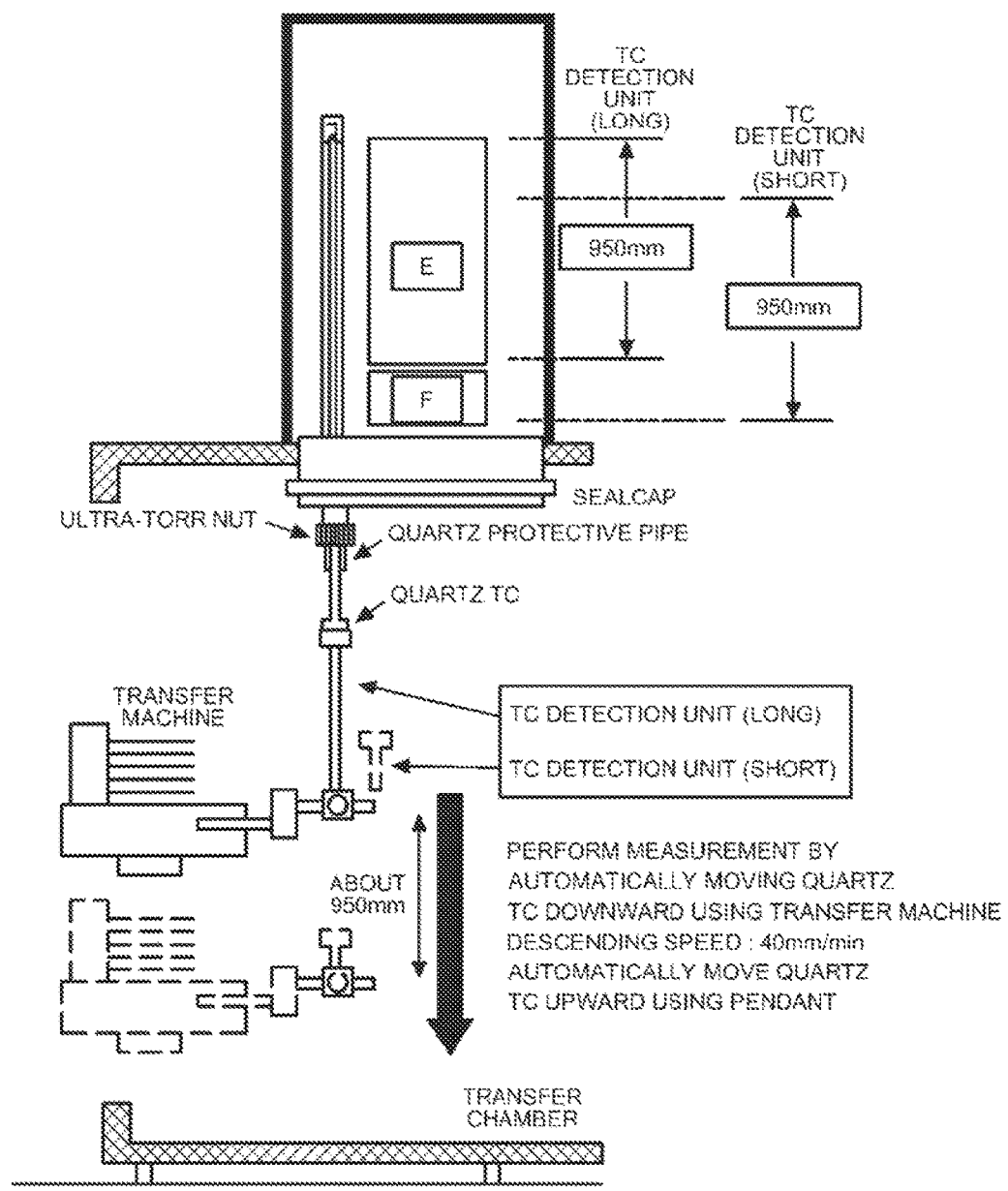
FIG. 13 illustrates a structure for measuring the length of a temperature-flat zone including an insulating plate region included in a process furnace according to a third embodiment of the present invention.

According to the present embodiment, as illustrated in the flowchart of FIG. 12, when execution of the temperature-flat length recipe is started, attachment of the temperature measuring device support mechanism to the fixture base unit fixed on the wafer transfer mechanism 125 is awaited and the temperature measuring device 18 is attached to the temperature measuring device support mechanism 10, but the present invention is not limited thereto. When the attachment of each of the wafer transfer mechanism 125, the temperature measuring device support mechanism 10 and the temperature measuring device 18 is completed, the execution of the temperature-flat length recipe may be started. However, in this case, the wafer transfer mechanism 125 is manually moved when the temperature measuring device support mechanism 10 is installed on the wafer transfer mechanism 125. For example, the wafer transfer mechanism 125 is manipulated using a dedicated terminal in an offline (local) state.

According to the present embodiment (second embodiment), not only the effects of the first embodiment but also the following effects may be obtained.

(7) Since an attachable/detachable temperature measuring device support mechanism may be added as an option for a longitudinal apparatus, a selling price of a product may be maintained constant. For example, the temperature measuring device support mechanism can be used without being limited by substrate processing (process) of the longitudinal apparatus and does not have an influence on a selling price of a product. Also, a temperature measuring system of a longitudinal apparatus may be manufactured using a set of a temperature measuring device support mechanism and a temperature-flat length recipe as described above. Thus, it is easy to remodel the longitudinal apparatus by, for example, exchanging components thereof with new components and to set up the longitudinal apparatus after the component exchange, regardless of an operator's skill.

(8) A sensor may be installed by fixing a fixture base unit as a first fixture on a wafer transfer mechanism 125. Thus, an operator can detect whether a temperature measuring device support mechanism is present or not while a door of the transfer chamber is closed without entering a transfer chamber, thereby guaranteeing the safety of the operator.

(9) A temperature-flat zone in a process furnace may be measured by preparing a temperature-flat length recipe and executing this recipe on a manipulation screen. Thus, an operator need not enter the transfer chamber and the safety of an operator is thus guaranteed.

(10) An operator may measure a temperature-flat zone in a process furnace by preparing and executing a plurality of temperature-flat length recipes. For example, different recipes prepared according to conditions of measuring the inside temperature of the process furnace, such as a temperature-flat length recipe A, a temperature-flat length recipe B and a temperature-flat length recipe C, may be executed to measure a temperature-flat length under various conditions.

(11) By executing a temperature-flat length recipe, a start position and an end position of measurement of a temperature-flat length may be uniformly maintained regardless of an operator's skill. Thus, the reliability of a result of measuring a temperature-flat zone in a process furnace may be increased and the performance of temperature control or the quality of a substrate may be maintained constant.

Modified Example of Second Embodiment

In the flowchart of FIG. 12 described above, execution of a temperature-flat length recipe is not terminated until a temperature-flat length is repeatedly measured a predetermined number of times. In contrast, even if the inside temperature of the process furnace is not within a predetermined temperature range, the measuring of the temperature-flat length is terminated when the temperature-flat length is measured a predetermined number of times. Thus, the number of times the temperature-flat length is measured may depend on an operator's skill.

Figure 8:
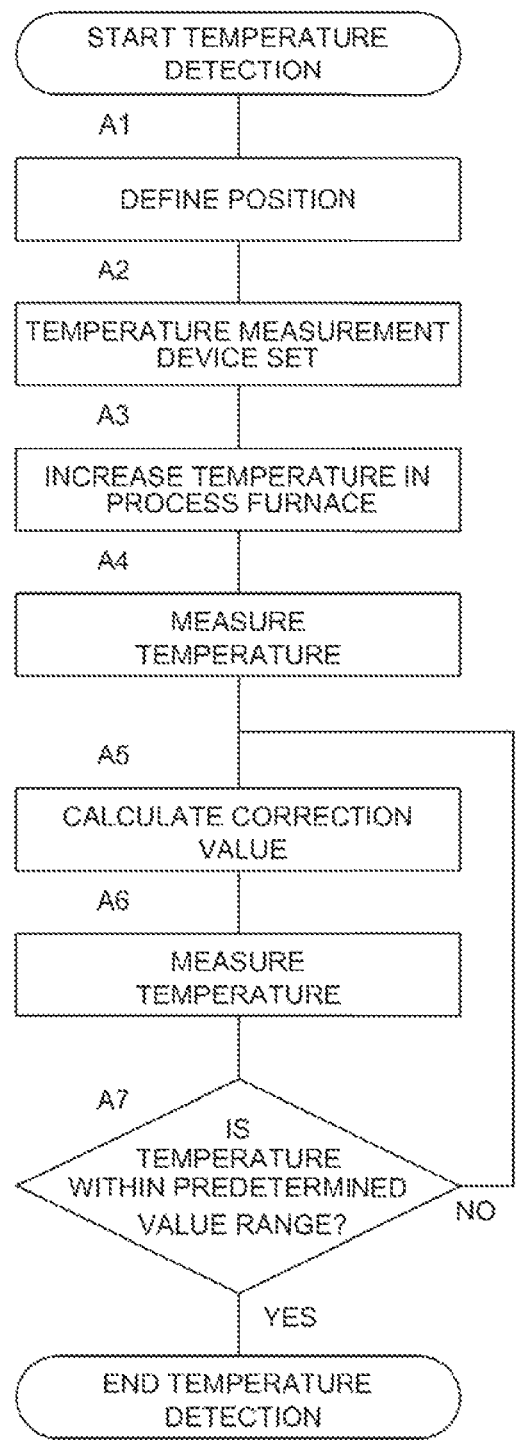
FIG. 8 is a flowchart of a method of correcting a temperature of the inside of a process furnace according to a first embodiment of the present invention.
Figure 14:
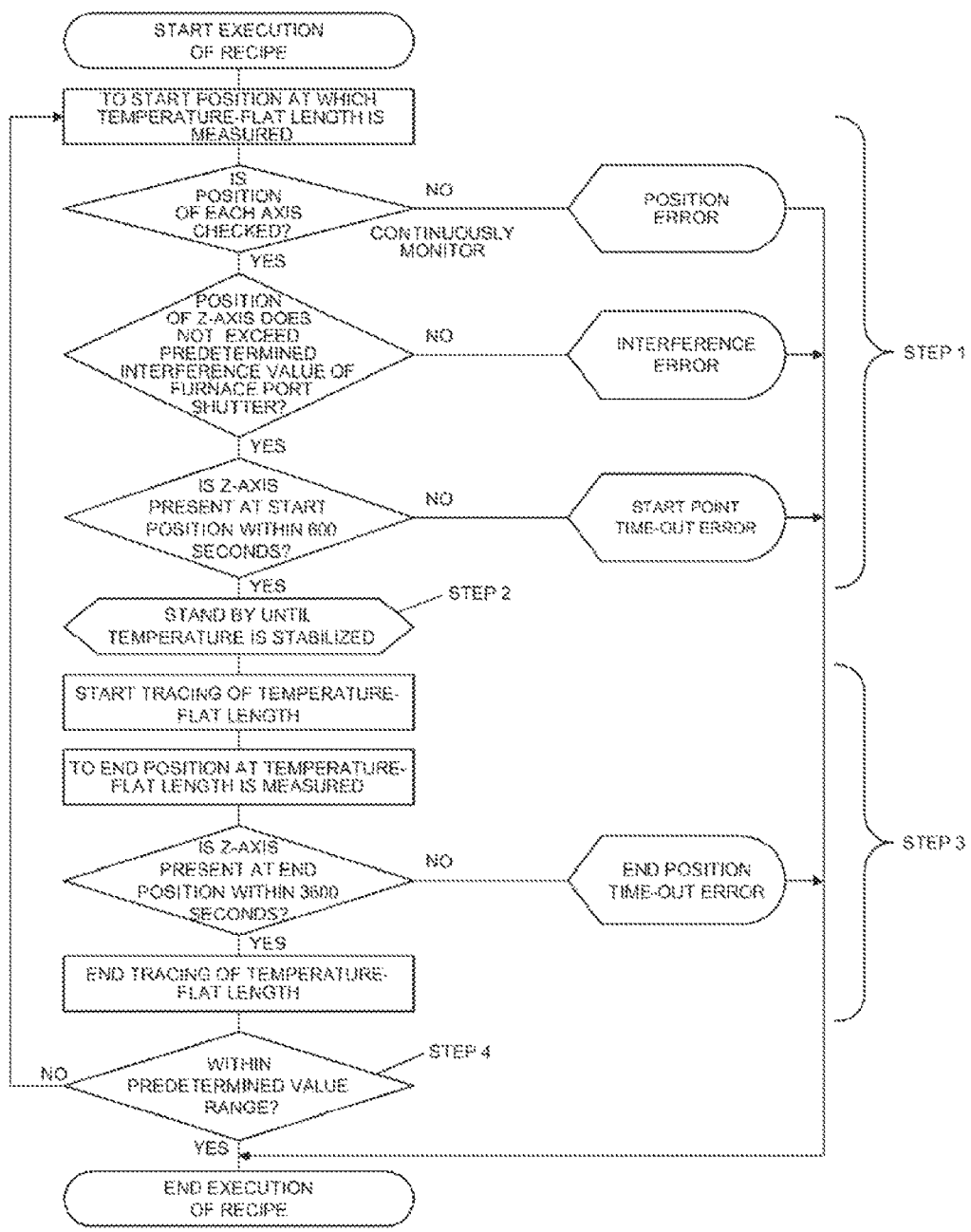
FIG. 14 is a flowchart of a temperature measuring method of the inside of a process furnace according to a modified example of the second embodiment of the present invention.

FIG. 14 is a flowchart of a modified example of the flowchart of FIG. 12, in which measuring of a temperature-flat length is terminated when temperature of the inside of a process furnace is within a predetermined value (predetermined temperature) range, similar to the flowchart according to the first embodiment (see FIG. 8). The flowchart of FIG. 14 is a flowchart of a temperature-flat control program including a step of determining whether a Z axis is present at a measurement start position (step 1), a step of waiting until the inside temperature of the process furnace is stabilized (step 2), a step of measuring a temperature-flat length in the process furnace (step 3), and a step of determining whether measuring of the temperature-flat length is terminated (step 4). As described above, the flowchart of FIG. 14 is different from the flowchart according to the second embodiment in that the flowchart of FIG. 14 further includes a step of determining whether a routine illustrated by the flowchart is to be repeatedly performed (and the content of the step).

The flowchart of FIG. 14 will be described in detail below.

First, in step 1, when execution of a temperature-flat length recipe is started, a movement step is performed to move to a start position at which measuring of a temperature-flat length is started. However, since the wafer transfer mechanism 125 is moved to the start position beforehand, when the execution of the temperature-flat length recipe is started, a subsequent process of checking a position is performed. Next, the position of each axis is checked, and the execution of the temperature-flat length recipe is terminated when a position error occurs. When a result of checking the position of each of the axes is satisfactory, interference checking is performed. Next, it is checked whether the position of a Z axis (operational shaft of the wafer transfer device elevator 125b) exceeds a predetermined furnace port shutter interference value. For example, it is checked whether the wafer transfer mechanism 125 and a furnace port shutter interfere with each other. When an interference error occurs, the execution of the temperature-flat length recipe is terminated. When a result of checking whether the wafer transfer mechanism 125 and the furnace port shutter interfere with each other is satisfactory, a start position is checked. Next, it is checked whether the Z axis is positioned at the start position within a predetermined time (e.g., 600 seconds). In the process of checking a position, the wafer transfer mechanism 125 is moved to the start position beforehand when the execution of the temperature-flat length recipe is started, and a subsequent temperature stability checking process is performed. Although the Z axis may be moved for fine adjustment if needed, when the Z axis is unable to reach the start position within the predetermined time, a start-position timeout error occurs and the execution of the temperature-flat length recipe is thus terminated. When it is determined that the Z axis is positioned at the start position within the predetermined time, the moving of the temperature measuring device 18 to the start position is terminated.

Next, in step 2, the temperature stability checking process of waiting until the inside of the process furnace is stabilized at a predetermined temperature is performed.

After the inside temperature of the process furnace is stabilized, measuring of a temperature-flat length is started. The temperature-flat length is measured by moving the temperature measuring device 18 downward by moving the wafer transfer device elevator 125b downward, as in the second embodiment. The temperature at each of measurement points in the process furnace is measured by the temperature measuring device 18. Also, data of the measured temperature is stored in the experimental temperature value memory 43 of the memory unit 67 of the main control device 65 via a temperature controller as illustrated in FIG. 7.

In step 3, the inside temperature of the process furnace is measured until the temperature measuring device 18 is moved to an end position at which the measuring of the temperature-flat length is terminated. Here, when it is determined that the temperature measuring device 18 is unable to reach the end position within a predetermined time, an end-position timeout error occurs and thus the execution of the temperature-flat length recipe is terminated. When it is determined that the temperature measuring device 18 is moved to the end position within the predetermined time, the measuring of the temperature-flat length is terminated. In this case, an operator calculates a temperature correction value based on obtained temperature data and stores it in the temperature correction value memory 41 included in the memory unit 67. Here, the temperature correction value may be automatically calculated based on temperature data obtained by the arithmetic control unit 66 and stored in the temperature correction value memory 41.

In step 4, the arithmetic control unit 66 repeatedly obtains temperature data a plurality of times until temperatures of a temperature-flat (flat temperatures) of the heater 206 are within a predetermined value range as described above. The arithmetic control unit 66 determines whether a temperature that satisfies a predetermined criterion, e.g., a temperature that is within a range of predetermined upper and lower values (a predetermined value range), is equal to or greater than a predetermined value. When the temperature does not satisfy the predetermined criterion, a temperature-flat zone of the heater 206 in the process furnace 202 is detected again. That is, the movement step of moving to the start position at which a temperature-flat length is measured is performed, and the temperature measuring device 18 attached to the temperature measuring device support mechanism 10 is moved upward by the wafer transfer device elevator 125*b* to return to the start position (step 1). Then, after the various checking processes are performed and the inside of the process furnace 202 is stabilized at the predetermined temperature (step 2), the temperature measuring device 18 is moved downward by the wafer transfer device elevator 125*b* to measure a temperature of a temperature-flat zone of the heater 206 (step 3). Then, when a result of measuring a temperature-flat length is within the predetermined value (the predetermined criterion), the arithmetic control unit 66 terminates the measuring of the temperature-flat length and obtaining of a temperature correction value is terminated.

Here, the position of each of the axes is continuously checked as in the flowchart of FIG. 12 (second embodiment). By checking the position of each of the axes in a predetermined cycle (e.g., a one-second cycle), the temperature measuring device 18 attached to the wafer transfer mechanism 125 may be rapidly stopped when an error occurs while the temperature measuring device 18 is moved upward/downward, and an accident, e.g., breaking of quartz due to contact between the temperature measuring device 18 and the quartz protective pipe, may be prevented from occurring.

Examples of a Result of Measuring a Temperature-Flat Length According to the First and Second Embodiments FIGS. 15 and 16 illustrate examples of temperature data obtained by the temperature controller 74 based on a result of measuring a temperature-flat length. FIG. 15 is a graph showing a result of measuring a temperature that satisfies a predetermined criterion (predetermined value range), in which a predetermined temperature setting range is equal to or greater than a predetermined value within a range of predetermined upper and lower temperature values (predetermined temperature±upper/lower value). For example, the predetermined temperature is 700° C., the upper/lower value is ±2° C., and a temperature-flat zone has a length of 900 mm or more. Also, the length of the temperature-flat zone is preferably 950 mm or more but may vary according to the predetermined temperature. However, a threshold value of the length of the temperature-flat zone is set to about 1,200 mm according to the size of the process furnace 202. Also, the predetermined temperature, although it may vary according to a process and a film type, is set as a temperature available for an annealing furnace, e.g., a temperature of 100° C. or less (e.g., room temperature) to about 1,200° C. In low-temperature processes that have been performed recently, there is a growing demand for measuring a temperature-flat length at 400° C. or less or 100° C. or less, as will be described in detail.

FIG. 16 illustrates a result of measuring a temperature-flat length four times. Referring to FIG. 16, a result of firstly measuring a temperature-flat length, a result of secondly measuring a temperature-flat length, and a result of thirdly measuring a temperature-flat length do not satisfy a predetermined criterion (predetermined value range), and a result of fourthly measuring a temperature-flat length satisfies the predetermined criterion (predetermined value range). Also, according to the present invention, when a temperature-flat length is measured, a temperature measuring start position may be continuously maintained using the wafer transfer mechanism 125. Also, when a temperature-flat length is measured using a temperature-flat length recipe, a range of measurement may be set and thus the temperature measuring start position and a temperature measuring end position may be continuously maintained.

Measuring of a temperature-flat length performed during setup is an important process according to the characteristics of the processing apparatus 100 and a criterion therefor is strictly set. Thus, a temperature-flat length should be measured a plurality of times so that it may be within a predetermined value range. Also, since a system in which the temperature measuring device 18 is attached to the wafer transfer mechanism 125 and the wafer transfer mechanism 125 is moved upward is established, a temperature-flat length in the process furnace 202 may be measured by executing a temperature-flat length recipe for measuring a temperature-flat length, similar to a case in which a process recipe for processing a substrate is executed. Thus, the temperature-flat length recipe may be executed to determine whether a temperature distribution in a process furnace is equal to or greater than a predetermined value within a range of predetermined temperature upper and lower values (predetermined temperature±upper/lower value). As described above, a temperature-flat length may be measured by setting control parameters, such as the flow rate of a gas, the pressure in a furnace, a heater temperature, etc., under process conditions that are the same as those when substrate processing is actually performed, as in the process recipe.

As will be described in detail below, an impact applied to not only a temperature-flat length in a substrate processing region but also temperature of the bottom of the substrate processing region at a predetermined temperature due to a temperature of an insulating plate region should be considered. In this case, temperature measurement is performed in not only the substrate processing region but also the insulating plate region.

Measuring of a temperature-flat zone in a process furnace described above in the first or second embodiment (including modified examples) is performed during setup of a substrate processing apparatus or during maintenance (repair) of the boat 217, which is a component of the process furnace (e.g., exchange of the boat 217).

Application Examples of the First and Second Embodiments (Including Modified Examples)

That is, according to the first or second embodiment (including modified examples), the method of setting up the processing apparatus 100 described above is provided as described below. The method includes at least one among a process of assembling components of a process chamber; a temperature correction process including a step of loading a temperature measuring device, which is installed to be attachable to/detachable from a transfer device for transferring a substrate to a retainer, into the process chamber, a step of measuring the inside temperature of the process chamber using the temperature measuring device by moving the transfer device downward, a step of calculating a correction value based on the inside temperature obtained by the temperature measuring device, and a comparison step of comparing the measured temperature with a predetermined criterion; and a process of heating the inside of the process chamber to a temperature which is greater than a substrate processing temperature after the temperature correction process is terminated.

If a temperature measured in the comparison step is within the predetermined criterion, the process of heating the inside of the process chamber and a substrate processing process of processing a substrate are performed using the correction value. If the temperature measured in the comparison step is unable to satisfy is the predetermined criterion, a movement step of moving the transfer device upward to a temperature measurement start position is performed. Then, the transfer device is moved downward again to measure a temperature-flat length in the process chamber.

Second Application Example of the First and Second Embodiments (Including Modified Examples Thereof)

That is, according to the first or second embodiment (including modified examples), means of maintaining (repairing) the processing apparatus 100 described above are provided as follows. The means includes at least a process of exchanging a component of a retainer with another component among components of the process chamber assembling components of a process chamber; and a temperature correction process including a step of loading the temperature measuring device, which is installed to be attachable to/detachable from the transfer device for transferring a substrate to the retainer, into the process chamber, a step of measuring the inside temperature of the process chamber using the temperature measuring device by moving the transfer device downward, a step of calculating a correction value based on the inside temperature obtained by the temperature measuring device, and a comparison step of comparing the measured temperature with a predetermined criterion.

If the temperature measured in the comparison step is within the predetermined criterion, a pre-coating treatment for protecting the other component using the correction value or a substrate processing process of processing a substrate is performed. If the measured temperature is unable to satisfy the predetermined criterion, a movement step of moving the transfer device upward to a temperature measurement start position is performed. Then, the transfer device is moved downward again to measure a temperature-flat length in the process chamber.

According to the following embodiment (a third or fourth embodiment), not only the effects of the first or second embodiment but also the following effects may be obtained.

(12) When the method of measuring a temperature-flat zone in a process furnace according to the first or second embodiment is applied to setup or maintenance of a substrate processing apparatus, non-driving times (a maintenance time, a setup time, etc.) of the substrate processing apparatus are eventually decreased, thereby improving the rate of operating the substrate processing apparatus.

Third Embodiment

In the first or second embodiment, a target of a range of measuring a temperature-flat length of a heater is a substrate processing region (E) as illustrated in FIG. 14. Thus, a temperature of an insulating plate region (F) is not needed. However, there is a growing need to obtain not only information regarding the temperature of the substrate processing region (E) but also information regarding the temperature of the insulating plate region (F). For example, for developing a heater, both a temperature of a substrate processing region and a temperature of an insulating plate region are measured so as to check a maximum temperature-flat length. For example, when a degree of heat dissipation from the insulating plate region is high, a gradient between the temperatures of the substrate processing region and the insulating plate region need to be checked. Even if a temperature variation occurs in a plane of the bottom of the substrate processing region due to heat dissipation from the insulating plate region, any influence caused by the insulating plate region may be detected by checking the gradient between the temperatures of the substrate processing region and the insulating plate region.

In the past, a result of processing a substrate (the quality of the substrate) could be slightly influenced by heat dissipation from a furnace port portion (insulating plate region) but was hardly influenced by a processing temperature. However, as a processing temperature becomes lower and lower, an impact applied to a result of processing a substrate caused by the processing temperature is not negligible. For example, if the processing temperature is 400° C. or less or 100° C. or less, the processing apparatus 100 is sensitive to a temperature change. As a demand to form a film at low temperatures has increased, the temperature of the insulating plate region (F) of FIG. 14 need to be measured. For example, a temperature of an introduced gas changes according to a change in the temperature of the insulating plate region (F) and thus a process gas introduction unit is influenced by the change in the temperature of the insulating plate region (F).

In the present embodiment (third embodiment), the above problem may be solved by simply changing the length of a detection unit which is a pillar as illustrated in FIG. 14. For example, when the length of the detection unit is short, a temperature measurement point may be changed without changing a measurement position of the wafer transfer mechanism 125 serving as a transfer machine.

Also, in the present embodiment (third embodiment), a temperature-flat length in the process furnace may be measured as in the second embodiment (including a modified example) and thus is not described again here.

As described above, the temperature of the insulating plate region (F) may be measured by changing a temperature measurement point in the process furnace (shifting this point to a lower point) by simply changing the length of the detection unit which is a pillar. Also, the temperature of the insulating plate region (F) may be measured by adjusting a range of measuring a temperature-flat length to be wider than usual without using a measurement fixture.

According to the present embodiment (third embodiment), not only the effects of the first and second embodiments but also the following effects may be obtained.

(13) A temperature of an insulating plate region that was not able to be measured can be measured. Accordingly, a process that is likely to be influenced by a temperature change can be handled by a substrate processing apparatus.

The present invention is not limited to the embodiments set forth herein and may be embodied in various different forms without departing from the scope of the invention. For example, a temperature measuring device support mechanism is not limited to a manipulator including a first arm and a second arm, and may be embodied as a multi joint robot, a slide type manipulator, a linear actuator, etc. Also, a plurality of temperature measuring devices may be installed, and the number of temperature measuring device support mechanisms may be determined by the number of temperature measuring devices.

The manipulation unit 69 may be a management device (e.g., a host computer, etc.) capable of managing a plurality of processing apparatuses 100.

Although cases in which a wafer is processed have been described in the above embodiments, the present invention is also applicable to various substrate processing apparatuses capable of processing a substrate such as a glass substrate of a liquid crystal panel, a substrate of a magnetic disk or an optical disc, or the like.

Also, the present invention is not limited to forming of an oxide film, and is also applicable to various treatments such as diffusion, chemical vapor deposition (CVD), annealing, ashing, etc.

According to the present invention, the workability of measuring a temperature of the inside of a process furnace may be improved, the reliability of a result of measuring a heater temperature-flat zone of a substrate processing apparatus may be improved, and the performance and quality of the substrate processing apparatus may be uniformly maintained.

Exemplary embodiments of the present invention as described above will be added herein.

Supplementary Note 1

According to one aspect of the present invention, there is provided a substrate processing apparatus including: a process chamber configured to process a substrate retained in a retainer loaded therein; a temperature measuring device configured to measure an inside temperature of the process chamber; a transfer device configured to transfer the substrate at least to the retainer; and a controller connected to at least the transfer device and the temperature measuring device, and control the transfer device and the temperature measuring device to move the transfer device to a predetermined position before the inside temperature of the process chamber is measured and to obtain the inside temperature by the temperature measuring device while vertically moving the transfer device with the temperature measuring device attached to the transfer device when the inside temperature of the process chamber is measured.

Supplementary Note 2

In the substrate processing apparatus of Supplementary note 1, the controller is configured to repeatedly obtain the inside temperature of the process chamber by executing a predetermined sequence for measuring the inside temperature of the process chamber to change a measurement condition.

Supplementary Note 3

In the substrate processing apparatus of Supplementary note 2, the controller is configured to terminate temperature measurement by the predetermined sequence without executing the predetermined sequence when the transfer device is not present at a predetermined start position.

Supplementary Note 4

In the substrate processing apparatus of Supplementary note 2, the controller is configured to terminate temperature measurement by the predetermined sequence when the transfer device is unable to reach a predetermined end position within a predetermined time.

Supplementary Note 5

In the substrate processing apparatus of Supplementary note 1, the controller is configured to calculate a temperature correction value based on the inside temperature obtained by the temperature measuring device while moving the transfer device downward.

Supplementary Note 6

According to another aspect of the present invention, there is provided a temperature measuring method, performed in a processing apparatus including a process chamber configured to process a substrate retained in a retainer loaded therein; a temperature measuring device configured to measure an inside temperature of the process chamber; a transfer device configured to transfer the substrate at least to the retainer; and a controller connected to at least the temperature measuring device and the transfer device and configured to control the transfer device and the temperature measuring device, the method including: moving the transfer device to a predetermined position before the inside temperature of the process chamber is measured; and measuring the temperature using the temperature measuring device by moving the transfer device with the temperature measuring device attached to the transfer device when the inside temperature of the process chamber is measured.

Supplementary Note 7

According to another aspect of the present invention, there is provided a method of manufacturing a semiconductor device, the method at least including a substrate processing process of processing a substrate while a retainer retaining the substrate therein is loaded in a process chamber; and a temperature measuring process of measuring the inside temperature of the process chamber using a temperature measuring device attached to a transfer device, wherein the temperature measuring process includes: moving the transfer device to a predetermined position; and measuring the inside temperature using the temperature measuring device while moving the transfer device to which the temperature measuring device is attached.

Supplementary Note 8

According to another aspect of the present invention, there is provided a substrate processing apparatus including: a load port configured to load or unload a carrier discharged with a substrate; a receiving shelf configured to accommodate the carrier; a placing shelf configured to place the carrier accommodated in the receiving shelf thereon; a first transfer device configured to transfer the carrier between the load port, the receiving shelf and the placing shelf; a retainer configured to retain the substrate therein; a second transfer device configured to transfer the substrate the carrier placed on the placing shelf and the retainer; a process chamber configured to process the substrate retained in the retainer; a temperature measuring device configured to measure an inside temperature of the process chamber; a temperature measuring device support mechanism configured to attach the temperature measuring device to the second transfer device; and a controller configured to control the first transfer device, the second transfer device, the receiving shelf, the load port, the temperature measuring device and the temperature measuring device support mechanism.

Supplementary Note 9

According to another aspect of the present invention, there is provided a method of manufacturing a semiconductor device, the method including: loading a carrier charged with a substrate into a load port; transferring the carrier from the load port to a receiving shelf through a first transfer device; transferring the carrier from the receiving shelf to a placing shelf through the first transfer device; transferring the substrate charged in the carrier placed on the placing shelf to a retainer through a second transfer device; loading the retainer to which the substrate is transferred into a process chamber; processing the substrate transferred to the retainer in the process chamber; unloading the retainer retaining the processed substrate from the process chamber; installing a temperature measuring device on the second transfer device; measuring the inside temperature of the process chamber using the temperature measuring device; and comparing the temperature measured using the temperature measuring device with a threshold value.

Supplementary Note 10

According to another aspect of the present invention, there is provided a substrate processing apparatus including: a process chamber configured to process a substrate; a retainer configured to retain the substrate therein; and a transfer device configured to transfer the substrate to the retainer, wherein a temperature measuring device support mechanism is installed on the transfer device to support a temperature measuring device configured to measure an inside temperature of the process chamber, and the transfer device is configured to vertically move the temperature measuring device installed on the temperature measuring device support mechanism.

Supplementary Note 11

According to another aspect of the present invention, there is provided a method of manufacturing a semiconductor device, the method including: a temperature correction process; and a substrate processing process of processing a plurality of substrates while a retainer retaining the plurality of substrates therein is loaded in the process chamber, wherein the temperature correction process includes: loading a temperature measuring device which is installed to be attachable to or detachable from a transfer device configured to transfer a substrate to a retainer, into the process chamber; measuring the inside temperature of the process chamber using the temperature measuring device; and comparing the temperature measured using the temperature measuring device with a threshold value.

Supplementary Note 12

According to another aspect of the present invention, there is provided a method of setting up a substrate processing apparatus, the method at least including: an assembly process of assembling components such as a heater and a reaction tube that form the inside of a process chamber; a temperature correction process; and a heating process of heating the inside of the process chamber to a temperature that is higher than a substrate processing temperature after the temperature correction process is terminated, wherein the temperature correction process includes: loading a temperature measuring device which is installed to be attachable to or detachable from a transfer device configured to transfer a substrate to a retainer, into the process chamber through the transfer device; measuring the inside temperature of the process chamber using the temperature measuring device; and comparing the temperature measured using the temperature measuring device with a threshold value.

Supplementary Note 13

According to another aspect of the present invention, there is provided a method of maintaining (repairing) a substrate processing apparatus, the method including: a process of exchanging components including a retainer and the like with other components among components forming the inside of a process chamber; and a temperature correction process, wherein the temperature correction process includes: loading a temperature measuring device which is installed to be attachable to or detachable from a transfer device configured to transfer a substrate to the retainer, into the process chamber through the transfer device; measuring the inside temperature of the process chamber using the temperature measuring device; and comparing the temperature measured using the temperature measuring device with a threshold value.

Supplementary Note 14

According to another aspect of the present invention, there is provided a temperature measuring system including: a temperature measuring device configured to measure the temperature of the inside of a process chamber processing a target object to be processed; a transfer device configured to transfer the target object; a fixture configured to attach the temperature measuring device to the transfer device; and a controller configured to control the temperature measuring device and the transfer device with the fixture to obtain the inside temperature using the temperature measuring device by moving the transfer device with the temperature measuring device attached to the transfer device via the fixture.

Supplementary Note 15

The temperature measuring system of Supplementary note 14 further includes a temperature measuring device support mechanism installed on the transfer device and configured to support the temperature measuring device, wherein the fixture is installed on the temperature measuring device support mechanism.

Supplementary Note 16

The temperature measuring system of Supplementary note 15 further includes a sensor installed on the transfer device, wherein the sensor detects whether the fixture is attached to the temperature measuring device support mechanism.

Supplementary Note 17

In the temperature measuring system of Supplementary note 14, the transfer device is configured to be moved to the predetermined position before the temperature measuring device is attached to the transfer device via the temperature measuring device support mechanism or before the inside temperature is measured by the temperature measuring device, and to be moved downward when the temperature of the inside of a process chamber is measured.

Supplementary Note 18

According to another aspect of the present invention, there is provided a transfer device for transferring a substrate to a retainer, the transfer device including a temperature measuring device support mechanism, which is configured to support a temperature measuring device configured to measure an inside temperature of the process chamber thereon, and configured to vertically move the temperature measuring device via the temperature measuring device support mechanism.

Supplementary Note 19

In the transfer device of Supplementary note 18, the transfer device is configured to be moved to the predetermined position before the temperature measuring device is attached to the transfer device via the temperature measuring device support mechanism or before the inside temperature is measured by the temperature measuring device, and to be moved downward when the temperature of the inside of a process chamber is measured.

Supplementary Note 20

According to another aspect of the present invention, there is provided a temperature measuring method of a processing apparatus including a temperature measuring device configured to measure the temperature of the inside of a process chamber processing a target object to be processed, a transfer device configured to transfer the target object, and a controller connected to the temperature measuring device and the transfer device and configured to control the temperature measuring device and the transfer device, the method including: moving the transfer device to a predetermined position before the inside temperature of the process chamber is measured; and obtaining the inside temperature by the temperature measuring device while moving the transfer device with the temperature measuring device attached to the transfer device when the inside temperature of the process chamber is measured.

Supplementary Note 21

According to another aspect of the present invention, there is provided a transfer device that is vertically movable while a temperature measuring device configured to measure an inside temperature of a process chamber processing a target object to be processed is attached to the transfer device, the transfer device including: a fixed fixture configured to attach the temperature measuring device thereto; and a sensor configured to sense whether a temperature measuring device support mechanism installed to be attachable to and detachable from the fixed fixture is attached to or detached from the fixed fixture.

Supplementary Note 22

In the transfer device of Supplementary note 21, the temperature measuring device support mechanism is attached to the fixed fixture at a predetermined position before the inside temperature of the process chamber is measured, and the transfer device is configured to move while the temperature measuring device is attached to the temperature measuring device support mechanism when the inside temperature of the process chamber is measured.

Supplementary Note 23

According to another aspect of the present invention, there is provided a non-transitory computer-readable recording medium having recorded thereon a program at least including a sequence of measuring an inside temperature of a process chamber using a temperature measuring device attached to a transfer device, in which the program further includes a sequence of moving the transfer device to a predetermined position; and a sequence of obtaining the inside temperature by the temperature measuring device while moving the transfer device with the temperature measuring device attached to the transfer device.

Supplementary Note 24

According to another aspect of the present invention, there is provided a program at least including a sequence of measuring an inside temperature of a process chamber using a temperature measuring device attached to a transfer device, in which the program further includes a sequence of moving the transfer device to a predetermined position; and a sequence of obtaining the inside temperature by the temperature measuring device while moving the transfer device with the temperature measuring device attached to the transfer device.

The present invention is not limited by a furnace available for manufacturing a semiconductor, and is applicable to various types of furnaces based on a technique of measuring temperature-flat lengths of various types of heaters.

What is claimed is:

1. A substrate processing apparatus comprising:
   a process chamber where a substrate charged in a boat is processed;
   a transfer device configured to transfer the substrate to the boat;
   a temperature measuring device attached to the transfer device and configured to measure an inside temperature of the process chamber; and
   a controller configured to control the transfer device and the temperature measuring device to: move the transfer device along with the temperature measuring device to be adjacent to the process chamber and insert the temperature measuring device into the process chamber from an outside of the process chamber before measuring the inside temperature of the process chamber; and measure the inside temperature via the temperature measuring device inserted in the process chamber from the outside of the process chamber while simultaneously moving the temperature measuring device by way of vertically moving the transfer device having the temperature measuring device attached thereto,
   wherein the controller is further configured to terminate temperature measurement by a predetermined sequence for measuring the inside temperature of the process chamber without executing the predetermined sequence when the transfer device is not present at a predetermined start position.

2. A non-transitory computer-readable recording medium having recorded thereon a program at least including a sequence of measuring an inside temperature of a process chamber using a temperature measuring device attached to a transfer device,
   wherein the program comprises:
   a sequence of moving the transfer device along with the temperature measuring device to be adjacent to the process chamber and inserting the temperature measuring device into the process chamber from an outside of the process chamber before measuring the inside temperature of the process chamber; and
   a sequence of measuring the inside temperature via the temperature measuring device inserted in the process chamber from the outside of the process chamber while simultaneously moving the temperature measuring device by way of vertically moving the transfer device having the temperature measuring device attached thereto,
   wherein temperature measurement is terminated without executing the sequence of measuring the inside temperature when the transfer device is not present at a predetermined start position.

3. The substrate processing apparatus of claim 1, wherein the controller is further configured to repeatedly obtain the inside temperature of the process chamber by executing the predetermined sequence for measuring the inside temperature of the process chamber to change a measurement condition.

4. The substrate processing apparatus of claim 1, wherein the controller is further configured to terminate temperature measurement by the predetermined sequence when the transfer device is unable to reach a predetermined end position within a predetermined time.

5. The substrate processing apparatus of claim 1, wherein the controller is further configured to calculate a temperature correction value based on the inside temperature obtained by the temperature measuring device while moving the transfer device downward.

6. The substrate processing apparatus of claim 1, further comprising:
   a fixture configured to attach the temperature measuring device to the transfer device; and
   a temperature measuring device support mechanism configured to support the temperature measuring device,
   wherein the fixture is attached to the temperature measuring device support mechanism.

7. The substrate processing apparatus of claim 6, further comprising a sensor installed on the transfer device,
   wherein the sensor is configured to sense whether the fixture is attached to the temperature measuring device support mechanism.

8. The substrate processing apparatus of claim 6, wherein the transfer device is further configured to be moved to a predetermined position before the temperature measuring device is attached to the transfer device via the temperature measuring device support mechanism or before the inside temperature is obtained by the temperature measuring device, and to be moved downward when the inside temperature of the process chamber is measured.

\* \* \* \* \*